United States Patent
Hardin et al.

(10) Patent No.: US 6,292,507 B1
(45) Date of Patent: Sep. 18, 2001

(54) METHOD AND APPARATUS FOR COMPENSATING A SPREAD SPECTRUM CLOCK GENERATOR

(75) Inventors: Keith Bryan Hardin; Craig Eric Hadady, both of Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 0 days.

(21) Appl. No.: 09/388,043

(22) Filed: Sep. 1, 1999

(51) Int. Cl.[7] .............................. H04B 1/69; H03D 3/24
(52) U.S. Cl. ................... 375/130; 375/376; 327/148; 327/157; 331/17; 331/34
(58) Field of Search ......................... 375/130, 374, 375/375, 376; 327/147–150, 156–159; 331/1 R, 14, 17, 18, 25, 34

(56) References Cited

U.S. PATENT DOCUMENTS

| | | |
|---|---|---|
| 5,003,553 | 3/1991 | Schluge et al. |
| 5,347,233 * | 9/1994 | Ishibashi et al. ..................... 331/2 |
| 5,375,148 * | 12/1994 | Parker et al. ..................... 375/376 |
| 5,488,627 | 1/1996 | Hardin et al. |
| 5,574,407 | 11/1996 | Sauer et al. |
| 5,631,920 | 5/1997 | Hardin . |
| 5,663,991 | 9/1997 | Kelkar et al. |
| 5,724,007 * | 3/1998 | Mar ..................................... 331/1 A |
| 5,760,637 | 6/1998 | Wong et al. |
| 5,831,483 * | 11/1998 | Fukuda ................................. 331/17 |
| 6,133,770 * | 10/2000 | Hasegawa ........................... 327/156 |

* cited by examiner

*Primary Examiner*—Don N. Vo
(74) *Attorney, Agent, or Firm*—John A. Brady

(57) ABSTRACT

An improved spread spectrum clock generator circuit is provided which automatically compensates for variations in passive component values and system gain and charge pump current in a Phase Locked Loop circuit. The pulse widths of the UP and DOWN outputs of the Phase Frequency Detector are monitored at particular intervals to determine the deviation error of these UP and DOWN signals, as compared to typical or nominal pulse-width durations. After an error is determined in the actual values of the pulse-width durations, the Phase Locked Loop (PLL) system is adjusted depending upon the magnitude and direction of the error signal. Changes in the PLL gain parameters, especially the VCO gain and charge pump current, have a significant effect on the PFD outputs, such that the width of the UP and DOWN signals vary as the frequency changes along the spread spectrum profile. At one portion of the spread spectrum profile, the "peak" (i.e., maximum) pulse width of these UP and DOWN signals will be a function of the spread spectrum's modulation profile and the PLL parameters. In addition to sampling for maximum pulse widths at the profile locations exhibiting peaks and valleys, the actual error profile may also exhibit a similarly large deviation from the target error profile at times just before the occurrence of the maximum peak and minimum peak (or "valley"). While determining precisely where within the profile these other substantial deviations occur is more difficult than monitoring the same signals at their maximum peaks, there are certain advantages to using the alternative locations along the error profile, which are described below.

34 Claims, 15 Drawing Sheets

METHOD AND APPARATUS FOR COMPENSATING A SPREAD SPECTRUM CLOCK GENERATOR

TECHNICAL FIELD

The present invention relates generally to image forming, computing, or microprocessor-based equipment and is particularly directed to spread spectrum clock generators of the type which reduce electromagnetic interference emissions. The invention is specifically disclosed as an automatically compensating spread spectrum clock generator that measures the pulse-width of the phase locked loop UP and DOWN signals and compares the actual pulse-width durations to typical or to predetermined values, and varies system parameters to correct any deviation error.

BACKGROUND OF THE INVENTION

Hi-speed digitally clocked systems are typically very noisy with regard to electromagnetic interference (EMI) emissions, unless some special care is taken at the design stage of equipment incorporating such clocked systems. One reliable and low-cost method for reducing EMI emissions is to use a spread spectrum clock such as is disclosed in U.S. Pat. Nos. 5,488,627 and 5,631,920. These patents disclose circuits in which the spread spectrum frequencies are varied by the use of programmable counters and by data stored in a memory circuit. These U.S. Pat. Nos. 5,488,627 and 5,631,920 are commonly-assigned, and are incorporated herein by reference in their entireties.

In a U.S. patent application, Ser. No. 09/169,110 (filed Oct. 8, 1998), a digital spread spectrum clock circuit is disclosed in which the clock is made variable by using Random Access Memory and a multiplexer to receive initiation data before the clock circuit is ready to run normally. This application is titled "Variable Spread Spectrum Clock," and is commonly-assigned to Lexmark International, Inc., and is incorporated herein by reference in its entirety.

While such prior spread spectrum clocks have often been disclosed or constructed using phase locked loop circuits, other types of frequency synthesizer circuits can be made into a spread spectrum clock, including digital locked loop circuits and delay locked loop circuits. One example of a digital locked loop circuit is disclosed in U.S. Pat. No. 5,079,519, and one example of a delay locked loop circuit is disclosed in U.S. Pat. No. 5,771,264.

The spread spectrum clock generator (SSCG) designs previously available have a design sensitivity to the voltage controlled oscillator gain, charge pump current, and passive component values (in connection with phase locked loop circuits). It would be an improvement to correct, automatically or under control of a computer program, the sensitive parameters by modifying the SSCG circuit.

SUMMARY OF THE INVENTION

Accordingly, it is a primary advantage of the present invention to provide a spread spectrum clock generator that automatically compensates for variations in passive component values, voltage control oscillator gain, and charge pump current, to provide a more accurate and lower EMI emission clock circuit. It is another advantage of the present invention to provide a spread spectrum clock generator that automatically compensates for variations in VCO gain, charge pump current, and passive component values using either a microprocessor-based control system, or a purely hardware logic control system. It is a further advantage of the present invention to provide a spread spectrum clock generator that automatically compensates for variations in VCO gain, charge pump current, and passive component values, while using an accurate external clock to calibrate an error-detecting circuit which measures "peak" (or maximum) UP and DOWN signals of a Phase Locked Loop circuit, or other frequency synthesizer system. It is a yet further advantage of the present invention to provide a spread spectrum clock generator that can be set up in a production line environment and, once the set-up is completed, will operate at the customer's site to compensate for the initial values of VCO gain, charge pump current, and passive component values, in which these component values are sufficiently repeatable so as to not require further set-up or calibration procedures once on the site.

Additional advantages and other novel features of the invention will be set forth in part in the description that follows and in part will become apparent to those skilled in the art upon examination of the following or may be learned with the practice of the invention.

To achieve the foregoing and other advantages, and in accordance with one aspect of the present invention, an improved spread spectrum clock generator circuit is provided which automatically compensates for variations in Voltage Controlled Oscillator gain and charge pump current in a Phase Locked Loop internal circuit, as well as for variations in passive component values. The present invention can be applied in a similar manner to other types of frequency synthesizer systems that have some similarities to Phase Locked Loop circuits, including those having signals that are analogous to Phase Locked Loop UP and DOWN signals. In a preferred embodiment, the UP and/or DOWN outputs of the Phase Frequency Detector (PFD) are monitored at certain times to determine the "peak" (or maximum) pulse-width of these UP and DOWN signals, and after an error (if any) is determined as compared to nominal (or typical) values for these pulse-width duration times in the UP and DOWN signals, the Phase Locked Loop (PLL) system is adjusted depending upon the magnitude and direction of the error signal. If the charge pump current magnitudes are approximately the same, then only one of the UP or DOWN signals need be measured.

Changes in the PLL gain parameters, especially the VCO gain and charge pump current, have a significant effect on the PFD outputs, such that the pulse-width of the UP and DOWN signals vary as the frequency changes along the spread spectrum profile. At one portion of the profile, the "peak" (i.e., maximum) pulse width of these UP and DOWN signals will be a function of the modulation profile and the PLL parameters. By measuring this peak pulse width of the UP and DOWN signals and comparing them to a theoretical pulse width, a compensation factor can be determined to offset this error. An automatic compensation scheme can be implemented by adjusting any one or combination of certain operating parameters of the circuit, including VCO gain, charge pump current, loop filter values, table values, and base number.

A Phase Locked Loop (PLL) circuit is the basis of the present invention, in which the output of the Voltage Controlled Oscillator (VCO) is directed into a divide-by-N circuit (also sometimes called a divide-by-N counter), and the output of this divide-by-N circuit is directed back to the Phase Frequency Detector (PFD) as the feedback signal. A reference signal, preferably a very accurate clock having a known frequency, is provided as the other input to the PFD circuit. This reference signal may itself be a divided signal, having a fraction of a system clock's output frequency.

As is well known in the art, the outputs of the PFD circuit are the UP and DOWN error signals, which are pulses that will be output quite often in a spread spectrum clock generator because the divide-by-N circuit will purposefully introduce an error at the feedback input of the PFD on a periodic basis. It is the accurate measuring of the pulse width of the UP and DOWN signals that makes the present invention feasible, because the theoretical pulse width is compared to the actual pulse width, and the compensation of any error is based upon this accurate measurement.

A preferred spread spectrum profile has rather distinct peaks and valleys, and will produce a corresponding error profile (i.e., the curve plotting the pulse widths of the UP and DOWN "error" signals) that also is somewhat "peaky." These profiles are created and controlled by introducing a different value for N at the divide-by-N counter, which forces a new frequency or phase to be emitted by the VCO, which is caused by forcing the PFD circuit to output either UP or DOWN pulses to the charge pump. In the preferred profile, there are 128 different time intervals that successively cause a new frequency to be emitted by the VCO, and it is preferred that the profile continuously repeat the same 128 intervals.

The frequency profile being generated using the preferred or "target" profile will be effected by the appropriate UP and DOWN signals, which in turn have their own error profile, again having a repetitive pattern of 128 intervals.

The error profile peaks (i.e., either a positive "peak" or a negative "peak," which sometimes is also called a "valley") will be quite distinct when inspecting the preferred error profile. In addition, if variations in the circuit parameters effect the PLL circuit such that the target profile is not accurately reproduced, then a fairly large error will occur in the pulse width of the UP and DOWN signals at the positive peak and at the negative peak. This is a logical place to attempt to capture the magnitude of this error in these UP and DOWN signal pulse widths.

In addition to sampling for maximum pulse widths at the profile locations exhibiting peaks and valleys, the actual error profile may also exhibit a similarly large deviation from the target profile at times just after the occurrence of the maximum peak and minimum peak (or "valley"). While determining precisely where within the profile these other substantial deviations occur is more difficult than monitoring the same signals at their maximum peaks, there are certain advantages to using the alternative locations along the error profile, which are described below.

Two different embodiments are extremely useful in implementing the present invention, and in the first case a microprocessor-type circuit is used along with a computer program to control the values for N that are loaded into the divide-by-N counter of the Phase Locked Loop. The other preferred embodiment uses hardware logic without a microprocessor or other sequential programmable device, yet still has the capability of sequentially placing the correct values for N into the divide-by-N counter. In both cases, it is preferred that a large number of logic gates and other types of digital circuits be used, preferably within a single integrated circuit, such as an ASIC (Application Specific Integrated Circuit). An ASIC is a very economical way of providing a large number of logic gates, and can even include a microprocessor with Random Access Memory.

In the embodiment using a processing circuit (such as a microprocessor built within an ASIC), the sequential logic of the processing circuit is used to index through a table of data stored either in Random Access Memory (RAM) or Read Only Memory (ROM), and the contents of the table will be sequentially directed into an adder circuit (to provide a "Base Number" offset), the contents of which are then loaded into the divide-by-N counter. In this manner, the processing circuit completely controls in real time the value for N, which in turn completely controls the feedback signal fed into the PFD input. This, in turn, controls the UP and DOWN signals that are fed into the charge pump which thereby controls the magnitude of the output current that is fed into the VCO.

In the processing circuit embodiment, it is preferred that a very stable clock signal be fed to the input of the multiplexer. In addition, the UP and DOWN signals are also fed to inputs of the same multiplexer. These clock, UP, and DOWN signals are selectively output from the multiplexer into a chain of in-series delay elements, which can be used to either instantaneously sample the period of the clock signal or sample the pulse width of one or both of the UP or DOWN signals, or the delay chain can be used to measure the "peak" or maximum pulse width or period of the UP or DOWN signals over several profile periods. Under control of the processing circuit, the output of the delay chain is analyzed and compared to one of the theoretical instantaneous pulse width or accumulated peak pulse width at that location in the error profile of the UP and DOWN signals.

In situations where the pulse width that is actually measured for the UP and DOWN signals deviates from the nominal or target pulse width at the same interval within the profile, then the processing circuit will know the amount of compensation required to correct this deviation, and will also know the correct direction to provide this compensation. The charge pump current can then be modified accordingly, or alternatively, the gain of the VCO could be modified. Either one of these could be modified and controlled directly by the processing circuit, although it is preferred to control the charge pump current of the Phase Locked Loop. As further alternatives, the loop filter values could be modified by the processing circuit, or table values in RAM could be directly modified by the processing circuit, or table values in ROM could be selected differently by the processing circuit, or (finally) the values of the base numbers could be selectively modified (if in RAM).

The use of an in-series delay chain is an important feature of the present invention, and by use of this delay chain a very accurate measuring device can be cheaply implemented to determine the actual pulse widths of the UP and DOWN signals. Since it is preferred that Call of the logic (or at least a large majority of the logic) of the circuit of the present invention be contained on one ASIC (or other integrated circuit), it is quite likely that the actual delay elements will not be very accurate as to their actual propagation delay times, although these delay elements will likely be very consistent when comparing one such delay element to another on the same ASIC.

As one skilled in the art would recognize, there are different methods that may be used to measure the pulse width of a signal, such as the UP or DOWN signals, or the period of a clock signal. For example, a circuit using a high-speed multivibrator or oscillator could be used with a counter to determine the pulse width or period. Another method (not illustrated) would be to use a resistor and capacitor to create an exponentially rising signal at the beginning edge of a pulse to be measured and a sample and hold at the end of the pulse to be measured. This output could then be read by an Analog to Digital (A/D) converter. A discharge circuit removes the voltage from the capacitor after each reading to get ready to measure the next pulse. A peak detector could also be added to find the maximum pulse width. Yet another enhancement (not illustrated) would be to replace the resistor with a current source that would create a linearly increasing signal that could be measured in a similar way. It should be understood that there are other existing methods that can be used to measure the pulse widths and calibration techniques to increase the accuracy.

While it is preferred that the delay elements be very accurate, the present invention recognizes that this will not likely occur when using an ASIC, however, the use of a relatively inexpensive ASIC or other similar circuitry outweighs the extra cost in using more accurate delay line circuitry. Consequently, the present invention periodically calibrates the delay line elements by measuring the number of delay line elements that change state during a period of a very accurate crystal clock. By use of the multiplexer, the clock signal will be sent through the same delay line elements as the UP and DOWN signals and this ultimately will provide a very accurate measurement of the pulse widths of these UP and DOWN signals.

The multiplexer will preferably output the clock signal for at least one period of that clock, and this output signal will be directed into the in-series delay line elements. Once the actual number of delay elements that make a logic transition for a single period of this clock becomes known, that information will then be used to determine the actual time required for a single propagation delay of a single delay element of this delay line circuit (also called the "delay chain"). Once this propagation delay time has been determined, the multiplexer will then begin outputting the UP signal during several profiles, so that the pulse width of that UP signal will be measured in units of number of delay elements. Since the actual propagation time delay is known for each of these delay elements, the actual pulse width in nanoseconds will immediately become known. After this has been determined, the multiplexer will then output the DOWN signal to the delay chain for several profiles. The number of delay line elements that make a logic transition during a DOWN pulse width will then become known, and this will be immediately translated into units of time, thereby providing the actual pulse width of the DOWN signal in nanoseconds.

As stated above, once armed with the knowledge of the actual pulse width time for the UP and DOWN signals, these physical quantities are compared to the theoretical pulse widths for a nominal (or target) profile. The deviation of the actual UP and DOWN pulse widths as compared to the nominal or typical similar pulse widths is then used as error information by the processing circuit to provide the correct compensation to the charge pump current. Depending upon the design approach for a particular implementation of the present invention, the in-series delay elements can be used to detect either the instantaneous UP and DOWN pulse widths, or to detect the "peak" UP and DOWN pulse widths over a particular profile. Moreover, multiple delay chains could be used if speed is very important, such that each signal (i.e., clock, UP, and DOWN) could be sent to a separate delay chain, which would obviate the need for a multiplexer. Some accuracy would likely be sacrificed, since the UP and DOWN delay chains would not be directly calibrated by the clock.

When implementing the present invention using a non-processing circuit solution, a Logic State Machine is used to control the divide-by-N counter values, and also to accept the data from the delay chain, which is used to determine the proper compensation for the PLL gain control, e.g., by controlling either the charge pump current or the gain of the VCO. In this so-called "all-electronic solution," the delay chain data preferably is stored in three separate registers that can hold serial binary numbers. The first register holds the UP signal data, the second register holds the DOWN signal data, and the third register holds the external clock data A fourth register is preferably used to hold the "target" or "typical" peak time for one of the UP or DOWN pulses, as according to the current step being performed by the Logic State Machine. The details of the methodology of the Logic State Machine will be discussed in the Detailed Description of the Preferred Embodiment, hereinbelow.

When the present invention is implemented with a processing circuit (such as a microprocessor), it is preferred that a computer program be used to analyze the clock data, the UP pulse width data, and the DOWN pulse width data. In conventional microprocessors available today, this will require a sequential computer program, since typical microprocessors perform in a sequential manner, although a parallel processing circuit could be used, if desired. An exemplary computer program is disclosed in greater detail in the Detailed Description of the Preferred Embodiment, hereinbelow.

One alternative implementation of the present invention would be to set up the spread spectrum clock generator in a "manual mode," in which the spread spectrum clock generator is tested at a production line set-up station so as to determine the initial values of VCO gain, charge pump current, and passive component values (i.e., when using a Phase Locked Loop circuit implementation). This alternative method of operation is useful when these Phase Locked Loop parameters are sufficiently repeatable to justify a single set-up operation that will remain effective over the life of the product, including its use during run time in the field at a customer's site.

Of course, another alternative implementation of the present invention would be to operate the spread spectrum clock generator in an "automatic mode" as described above, however, the measurement and associated calibration of the Phase Locked Loop parameters only occurs at very infrequent intervals. This would be feasible for spread spectrum clock generator circuits made of components that, again, have parameters that are sufficiently repeatable to justify calibration procedures only at very long time intervals (such as once per month, or once per year, for example).

Still other advantages of the present invention will become apparent to those skilled in this art from the following description and drawings wherein there is described and shown a preferred embodiment of this invention in one of the best modes contemplated for carrying out the invention. As will be realized, the invention is capable of other different embodiments, and its several details are capable of modification in various, obvious aspects all without departing from the invention. Accordingly, the drawings and descriptions will be regarded as illustrative in nature and not as restrictive.

BRIEF DESCRIPTION OF THE DRAWINGS

The accompanying drawings incorporated in and forming a part of the specification illustrate several aspects of the present invention, and together with the description and claims serve to explain the principles of the invention. In the drawings:

DETAILED DESCRIPTION OF THE PREFERRED EMBODIMENT

Reference will now be made in detail to the present preferred embodiment of the invention, an example of which is illustrated in the accompanying drawings, wherein like numerals indicate the same elements throughout the views.

Figure 1:
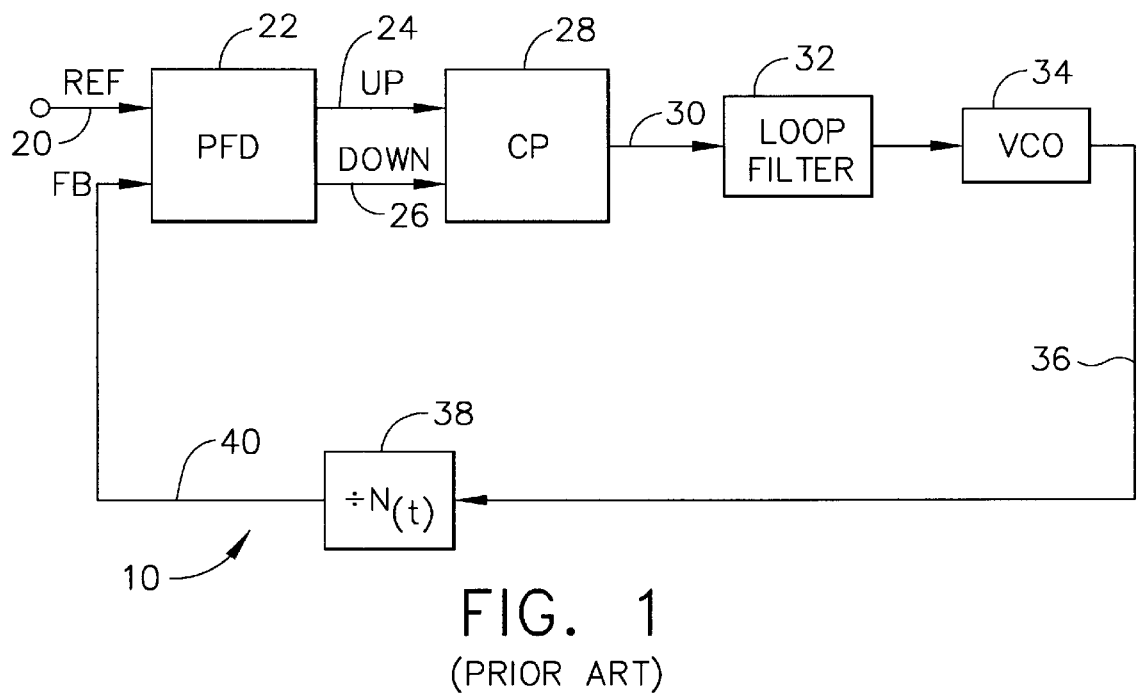
FIG. 1 is a block diagram of a prior art Phase Locked Loop circuit having a divide-by-N counter that varies its value for N over time.

Referring now to the drawings, FIG. 1 depicts a conventional Phase Locked Loop (PLL) known in the prior art, and generally depicted by the reference numeral 10. A reference signal at 20 is directed to an input of a Phase Frequency Detector (PFD) 22, which also has a second "feedback" input at 40. PFD 22 outputs two signals called UP and DOWN, respectively at the reference numerals 24 and 26, which are connected to the input of a charge pump 28.

The charge pump current is an output at 30 that is directed to a loop filter 32 that conditions the signal before sending it on to a Voltage Control Oscillator (VCO) 34. The output of VCO 34 is a frequency signal that is proportional to the output voltage of the charge pump at 30. The output 36 of VCO 34 is directed to a divide-by-N circuit 38, which is also called an "N counter," and which will output a pulse after receiving a cumulative total of N input pulses. The output of the N counter 38 is directed to the input of the PFD 22 as the feedback signal 40.

If the value of N for the N counter 38 remains constant, then the PLL circuit 10 will behave as a standard Phase Locked Loop. However, for use in the present invention, the value for N in the N counter 38 is varied over time, and consequently on FIG. 1 the depicted block at 38 carries the designation of N(t), signifying that the value of N varies over time. As is known in the prior art, this variance of N can be controlled by some type of processing circuit (such as under control of a microprocessor), or it can be controlled by a hardware logic circuit that contains no central processing unit.

Figure 2:
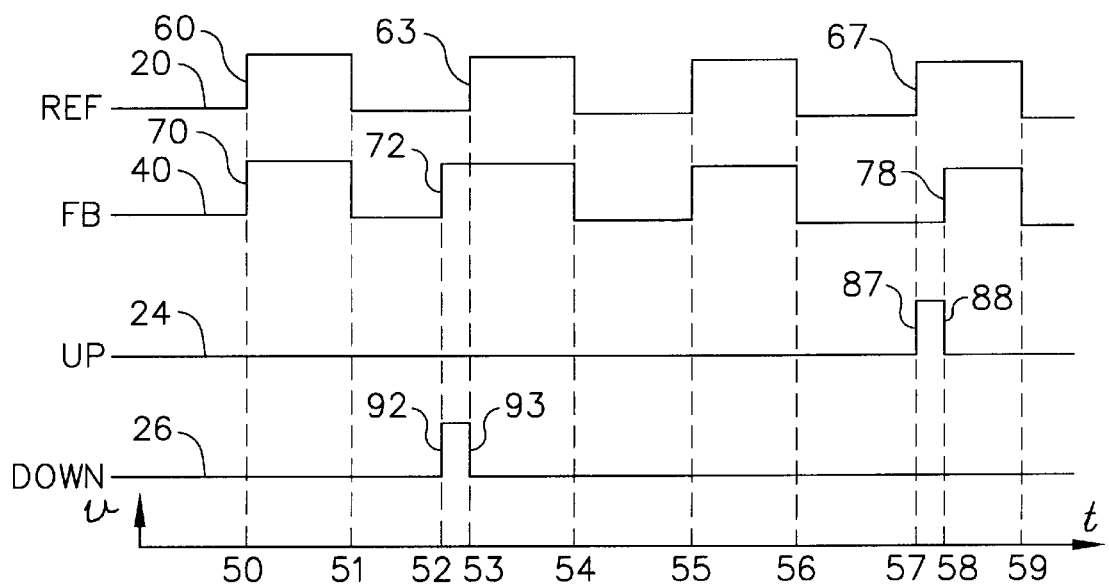
FIG. 2 is a timing diagram showing the relationship of some of the signals of the circuit disclosed in FIG. 1.

FIG. 2 illustrates the waveform of some of the signals that are used in the Phase Locked Loop 10 of FIG. 1. In FIG. 2, the Reference Signal (REF) 20, Feedback Signal (FB) 40, UP signal 24, and DOWN signal 26 are depicted as voltage signals along the vertical or Y-axis versus time (along the horizontal or X-axis). The graphs of FIG. 2 are presented mainly to illustrate the generation of the UP and DOWN signals 24 and 26, respectively, in the prior art PLL circuit 10.

Starting at a time mark 50 along the X-axis, the reference signal 20 makes a positive transition at 60, and the feedback signal 40 makes a similar positive transition at 70. Since both of these transitions at 60 and 70 take place at substantially the same time (i.e., at time mark 50), there is no logic transition in either the UP or DOWN signals 24 and 26. At the time mark 51 along the X-axis, the reference and feedback signals 20 and 40 make a negative logic transition back to Logic 0.

At the next time mark 52, the feedback signal 40 makes a positive transition at 72 from Logic 0 to Logic 1, which occurs in time before the reference signal 20 makes its next Logic 1 transition at 63 (i.e., at time mark 53). In Phase Locked Loop vernacular, the Phase Frequency Detector 22 must now conclude that the VCO is running too fast, because its effective output pulse, which becomes the feedback signal 40, arrived too early in time, since it arrived before the positive transition of the reference signal at 63. Consequently, the PFD 22 will generate a DOWN Pulse (i.e., to "slow down" the VCO), as can be seen at the logic transitions at 92 and 93 on the DOWN signal graph on FIG. 2.

In the example of FIG. 2, the reference and feedback signals make a negative transition at the time mark 54, and both of these signals then make a positive logic transition virtually simultaneously at the time mark 55. Consequently, there is no UP or DOWN signal transition at time mark 55. At the time mark 56, both the reference and feedback signals again make a negative logic transition.

In the example of FIG. 2, the reference signal 20 makes a positive logic transition at 67, however, the feedback signal 40 does not make its next positive logic transition until later in time, at 78. Since the reference signal logic transition 67 occurs at a time mark 57, which is earlier in time than the next time mark at 58 (which is when the feedback signal makes its logic transition at 78) an UP pulse will be generated by the PFD 22 at the time mark 57. This is shown on FIG. 2 where the UP signal 24 makes a transition to Logic 1 at 87, and remains at the high logic level until it makes a negative transition to Logic 0 at 88. Both the reference and feedback signals make a negative logic transition virtually simultaneously at a time mark 59.

Figure 3:
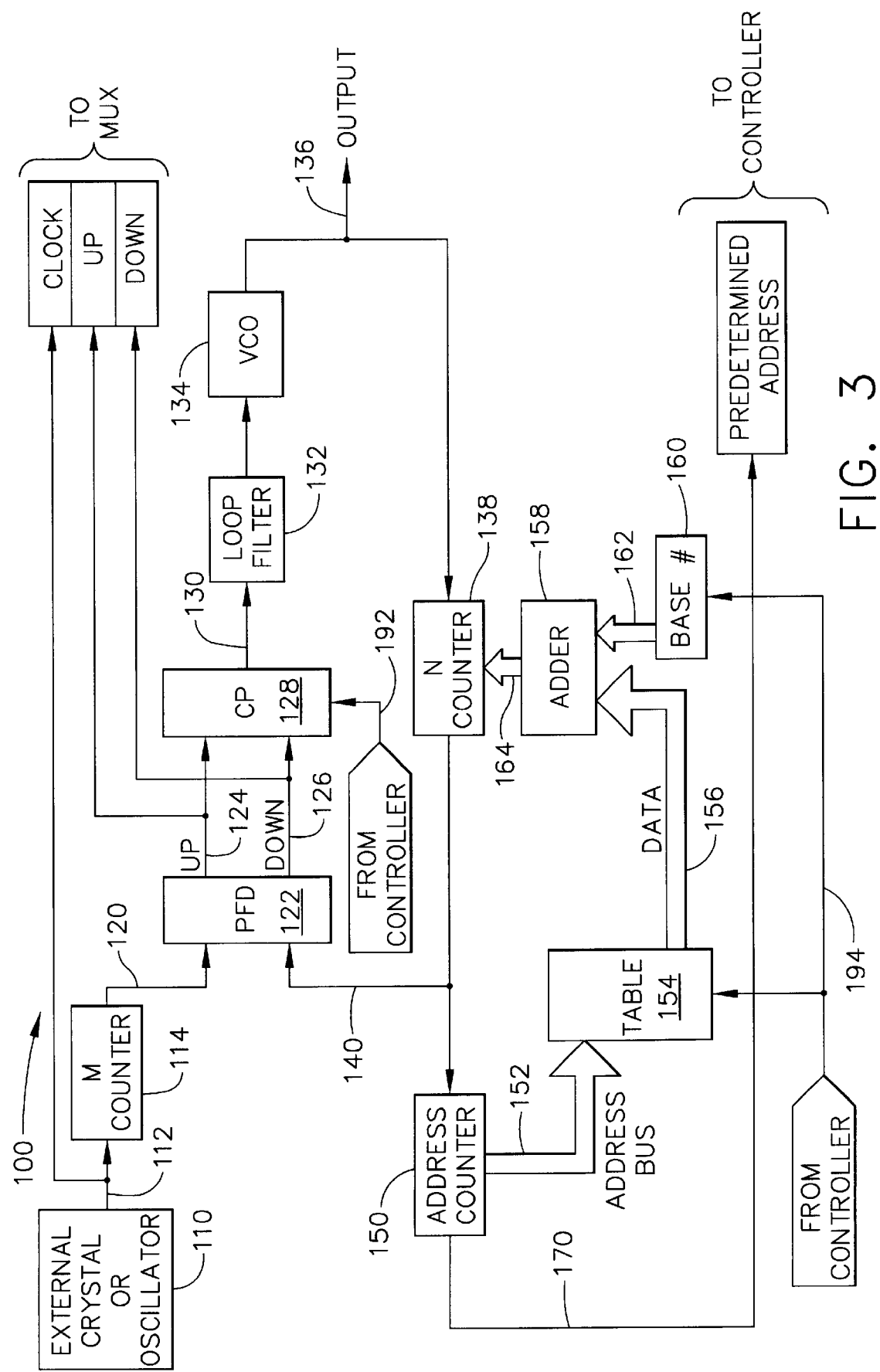
FIG. 3 is a block diagram of a spread spectrum clock generator circuit, using a Phase Locked Loop, as constructed according to the principles of the present invention.

Referring now to FIG. 3, a Phase Locked Loop circuit 100 similar to that depicted in FIG. 1 is made up of a PFD 122, charge pump 128, loop filter 132, VCO 134, and an N counter 138. The PFD has an UP output at 124, and a DOWN output at 126. The charge pump output is at 130, and the VCO output (and the main circuit frequency output) is depicted at 136. The output of the N counter 138 is depicted at 140, which also represents the feedback input signal to the PFD 122. The reference input to the PFD 122 is depicted at 120.

A very accurate external crystal or oscillator circuit is provided at 110, which has an output at 112 that drives into an M counter 114. The output of the M counter 114 provides the reference signal 120 to the PFD 122. In an exemplary circuit, the external crystal/oscillator 110 would output a frequency of 48 MHz, which as stated above, is a very accurate frequency source, both as to repeatability, and to actual time period. If, for example, the value for M is equal to ten (10), then the output frequency at 120 of M counter 114 would be 4.8 MHz.

While running, the PLL will vary its output frequency at 136 as the value of N for N counter 138 is changed in real time. A detailed description of the operations of this type of circuit is provided in U.S. Pat. Nos. 5,488,627 and 5,631,920, which are commonly-assigned and are incorporated by reference herein, as noted hereinabove.

In the present invention, the clock signal at 112, UP signal at 124, and DOWN signal at 126 are all provided as inputs to a multiplexer, which is described in more detail with reference to FIG. 4. In addition, a controller circuit (described in greater detail hereinbelow) provides an output signal at 192 that is capable of controlling the charge pump current. It will be understood that the controller could easily control the gain of the VCO 134 instead of the charge pump current, however, it is preferred for the charge pump current to act as the controlled process variable in the present invention, because variations in the charge pump current can be made more quickly without causing instabilities in the smooth operation of the VCO portion of the PLL circuit. While the gain of the VCO can be controlled, it will be understood that controlling the charge pump current will essentially have the same overall effect on the output frequency at 136. It will be further understood that additional types of frequency synthesizer circuits other than Phase Locked Loops could be used to advantage according to the principles of the present invention.

Figure 8:
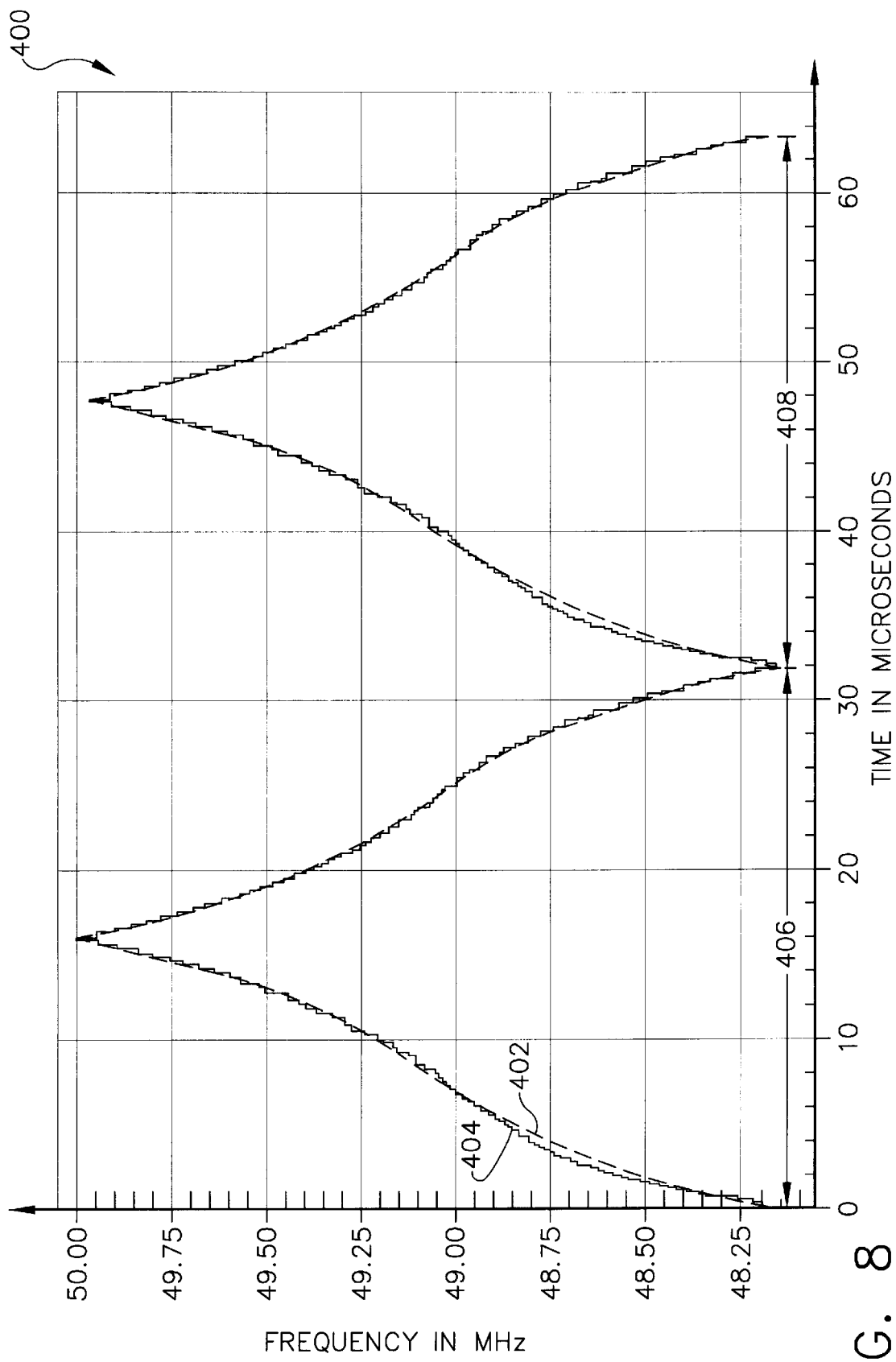
FIG. 8 is a graph of a preferred simulated profile of a spread spectrum clock generator.

The output 140 of N counter 138 is also directed to an address counter 150. Address counter 150 contains pointer-type information that is loaded onto an address bus 152, which represents a particular position or location within the desired profile of the spread spectrum clock generator. In the preferred embodiment of the present invention, the profile of the spread spectrum clock generator will have the appearance as depicted in FIG. 8, which represents a simulated profile of 50 MHz, with a deviation of +0/−3.75%. On FIG. 8, a target profile is depicted at 402, which has a period designated at 406 in which one cycle of the profile has a duration of approximately 32 microseconds. This period 406 contains 128 different time intervals which each have a particular target frequency for the output signal 136. During a particular one of these time intervals, the target frequency will remain constant. However, when it is time to advance to the next time interval on the profile, the frequency will be changed either up or down, under the control of the PLL circuit by use of a new value for N that is loaded into the N counter 138. Once the entire profile has been achieved, the pattern repeats, as noted on FIG. 8 by the identical profile during the second depicted period at 408.

A table 154 is depicted as a hardware block on FIG. 3, however, this table represents memory locations either in RAM (Random Access Memory) or ROM (Read Only Memory). In the preferred embodiment, table 154 contains memory locations sufficient to hold four-bit numeric values, for example, values between zero (0) through five (5), and these values represent variations in the value for N that will be loaded into the N counter 138. The output data from table 154 is directed along a data bus 156 into an adder circuit 158. The other data input for adder 158 is another data bus 162 that is derived from a "base number" 160, which is a numeric value either stored in RAM or ROM, depending upon the preference of the system designer.

For example, the numeric value for the base number could be equal to twenty-four (24), and the table 154 could contain numeric values in the range of 0–5. These numbers will be added together by adder 158, the output of which will be numeric values in the range of 24–29, which is presented to the N counter 138 by way of a data bus 164. In this example, the effective value for N will be in the range of 24–29, inclusive, which will provide the variations required for the profile as seen on FIG. 8. It must be remembered that a change in the value for N at the output of N counter 138 will cause the charge pump 128 to receive either an UP signal at 124 or a DOWN signal at 126, thereby varying the frequency output by the VCO 134.

If the values for the base number 160 and the table 154 are stored in RAM or other type of programmable register, then the system controller can load new values into both the table 154 and the base number memory location 160, as desired. Once a system is set up, however, the loading of new values will not necessarily occur unless some of the component parameters become far out of normal ranges due to component degradation or to some type of environmental conditions. If that should happen, the controller can load a new base number 160 via a signal line 194, and this will change the base value for N that will be added (by X adder 158) to the table values being output along the data bus 156. In addition, since the table values themselves can be changed (assuming table 154 resides in RAM), then a greater variation in numeric values can also be easily implemented under control of a controller 190 (on FIG. 4) by loading new values into table 154 via the signal line 194.

If the table 154 is stored in ROM, which is the preferred embodiment of the present invention, then its values will be sequentially loaded into adder 158, which eventually becomes the value for N once added to the base number 160. In this circumstance, base number 160 could also be stored in ROM but alternatively could easily be stored in RAM so that the base number can be changed in situations where a different range of values for N are required (due to environmental conditions or degraded component values, etc.). In this preferred embodiment in which table 154 resides in ROM, it is preferred that the charge pump current be controlled via signal line 192 by the controller 190.

Address counter 150 also has an output at 170 that becomes active upon decoding a particular predetermined address among all of the addresses stored in address counter 150. This signal 170 is also sent to the controller 190 to indicate when a particular profile location has been output along address bus 152, and acts as a decoder for a particular single address. This signal 170 preferably is used to inform the controller 190 of a particular event, such as when a particular interval in the profile has been reached so as to perform a measurement of the pulse width time for an UP or DOWN signal, or to calibrate a timing measurement circuit, which will be discussed in greater detail hereinbelow.

Figure 4:
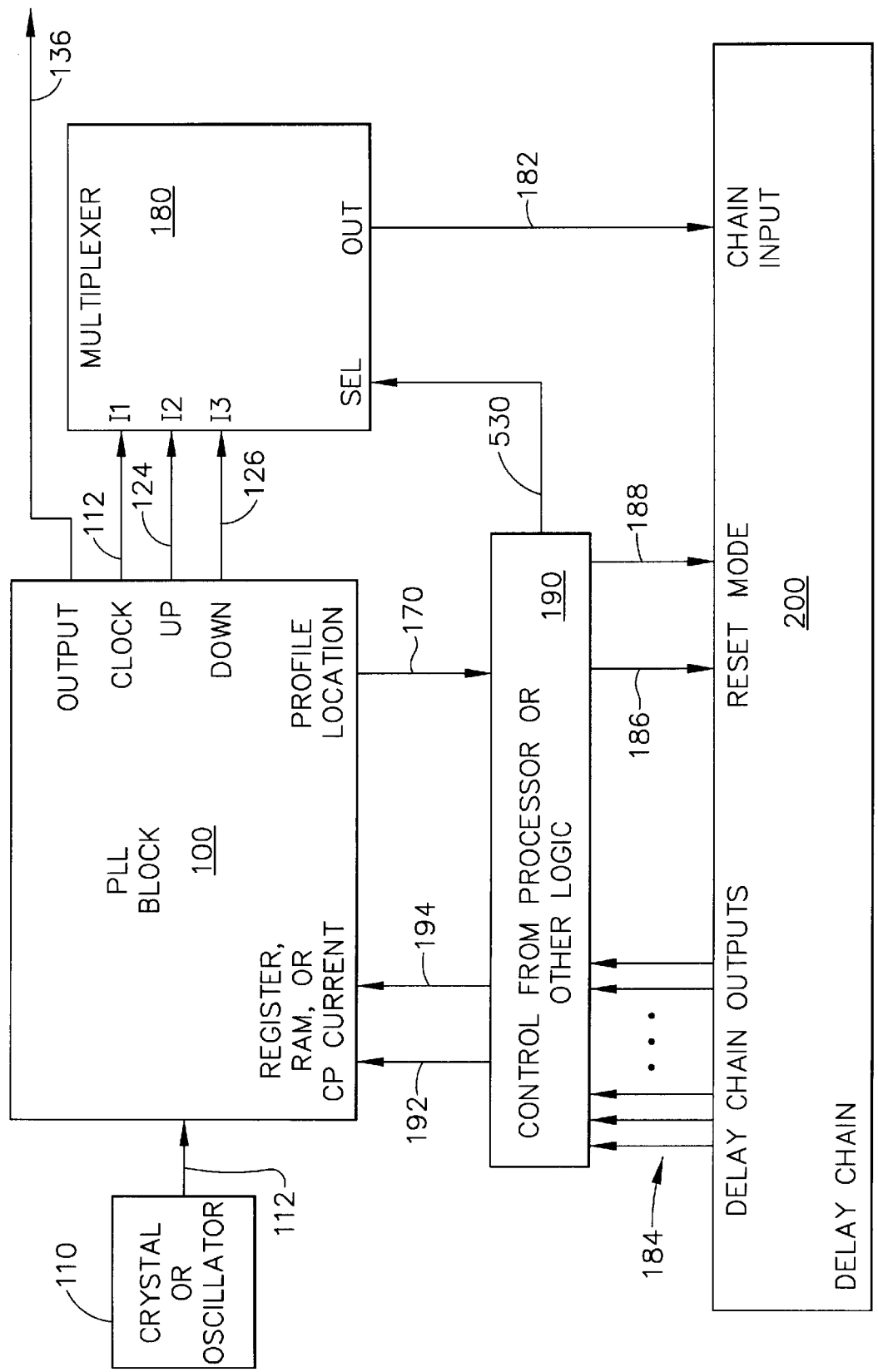
FIG. 4 is a block diagram of the spread spectrum clock generator circuit of FIG. 1, and additionally a multiplexer and delay chain circuit, as well as a processing circuit, as constructed according to the principles of the present invention.

Referring now to FIG. 4, the Phase Locked Loop circuitry 100 of FIG. 3 is referred to as a "PLL Block" 100 on FIG. 4. On FIG. 4, the crystal/oscillator 110 outputs its clock signal at 112 into the PLL Block 100. A multiplexer 180 is depicted as receiving output signals from PLL Block 100, including the clock 112, the UP signal 124, and the DOWN signal 126. Multiplexer 180 also receives a "select" signal 530 from the controller 190. The PLL Block 100 also has an output signal at 136, which is the main variable frequency output signal that becomes the spread spectrum clock signal.

Multiplexer 180 outputs a signal at 182, which will be the same signal as one of its input signals at its inputs I1, I2, or I3, as seen on FIG. 4. The determination as to which one of these input signals will be connected to the multiplexer's output will be discussed in greater detail with reference to the description of the circuitry on FIGS. 5–7. As seen on FIG. 4, the output signal 182 from multiplexer 180 is directed to a "Chain Input" that is part of a delay chain 200, which will be more fully described with reference to FIGS. 5–7, hereinbelow.

Controller 190 will preferably comprise a microprocessor or other type of integrated circuit that contains a central processing unit, such as a microcontroller or an ASIC (Application Specific Integrated Circuit) which contains a microprocessor unit. However, be controller 190 may also comprise a fixed hardware logic circuit which contains enough logic gates so as to essentially act as a sequential State Machine, and can act with sufficient intelligence to load new values to the table to control the profile, and further can load a new base number to the PLL Block 100, which then adds the base number to a number generated by a table so that the result is submitted to a counter, such as N counter 138. This State Machine may also control the charge pump or VCO gain with or without controlling the table or base number. This non-processor control logic will also be referred to herein as an "all-electronic solution," although a microprocessor circuit certainly also contains electronics. With reference to FIG. 4, the controller 190 receives certain input signals and performs certain functions based upon the analysis of those input signals, regardless as to whether its internal circuitry is microprocessor-based or an "all-electronic solution."

The delay chain 200 outputs one or more "Delay Chain Output" signals at 184, which are input to the controller 190. The delay chain outputs 184 generally comprise multiple parallel signals generated by a large number of flip-flop outputs, in which there is a single flip-flop for each of the delay elements of delay chain 200. This will be described in greater detail in reference to FIG. 5. Controller 190 determines which signal is output from multiplexer 180 by use of an output signal 530, controls the delay chain 200 by use of a "Reset" output signal 186 and a "Mode" signal 188, and also controls certain parameters within the PLL Block 100.

The Select Signal 530 to the multiplexer 180 comprises a hardware output from the controller 190 in the all-electronic solution circuit, in which the State Machine determines the value for this signal. Of course, its value will determine which of the three inputs, I1, I2, or I3, will be directed to the output of multiplexer 180. In cases where the controller 190 includes a central processing unit (such as a microprocessor), it is preferred that this Select Signal 530 not be an actual hardware input line between the microprocessor and a select input of the multiplexer 180, but instead it is preferred that multiplexer 180 contain an addressable register which can be loaded by the processing circuit (i.e., controller 190) via some type of data line or data bus.

The signals 192 and 194 are outputs from the controller 190, and as discussed above, the signal 192 can directly change the current of charge pump 128, assuming of course that charge pump 128 has a programmable charge current based upon an input signal. An alternative is to use the signal 194 which can be used by controller 190 to load different values into table 154 and base number 160. This scenario, of course, assumes that the table 154 and base 160 comprise memory elements that can be modified, such as RAM or registers. In the preferred embodiment of the present invention, table 154 comprises ROM, and the controller 190 directly interfaces via signal 192 to change the current of charge pump 128, when desired.

Figure 5:
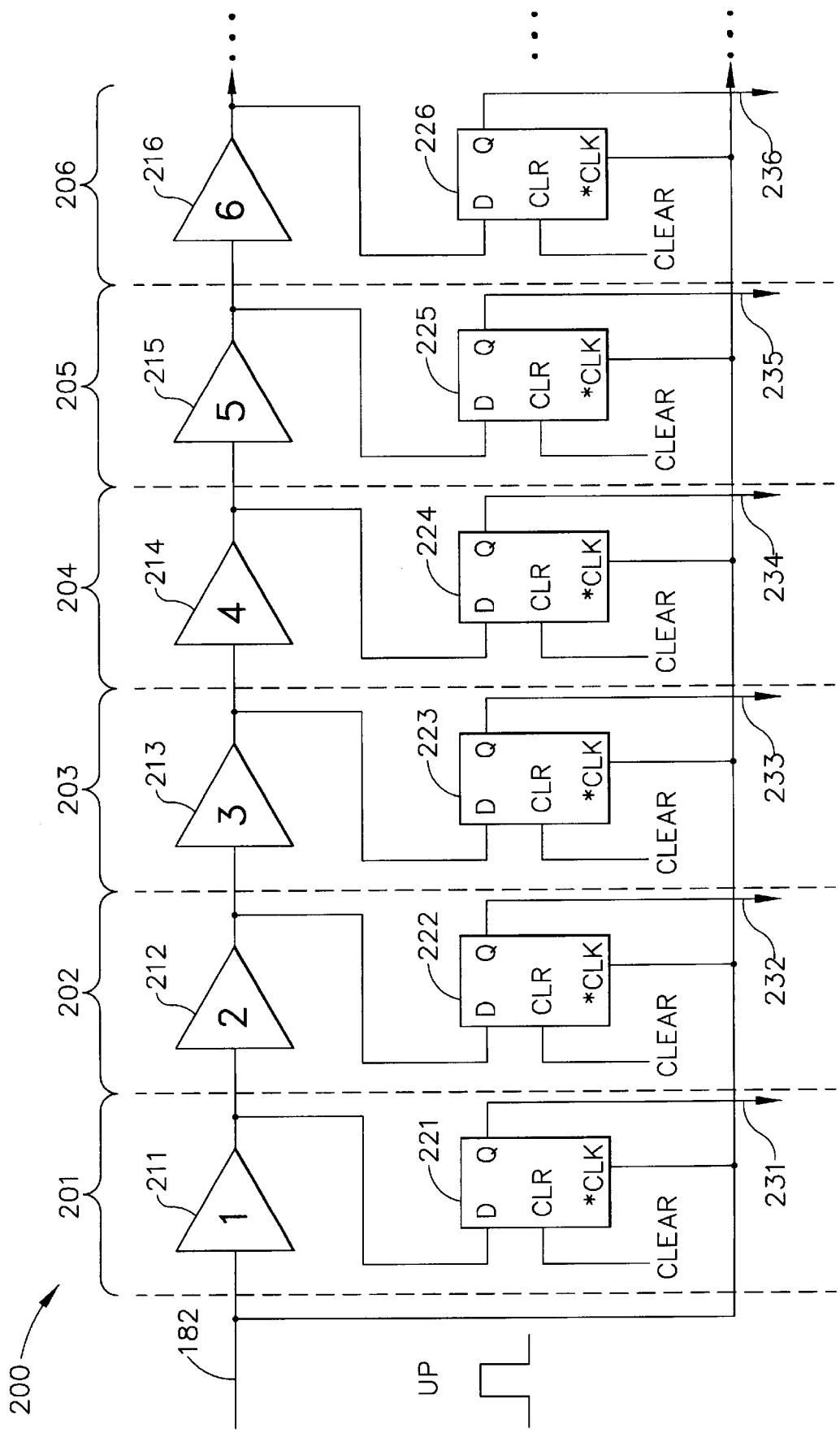
FIG. 5 is a schematic diagram of a first embodiment of an in-series delay chain used in the circuit of FIG. 4.

Referring now to FIG. 5, a "simple" delay chain 200 is illustrated as comprising multiple in-series delay elements 211–216, each having a D flip-flop 221–226. Each flip-flop has an output signal, i.e., signals 231–236, and the combination of the delay element, flip-flop, and the flip-flop's output signal comprises a delay stage, referred to by the reference numerals 201–206. As seen on FIG. 5, the input to the delay chain 200 is the output 182 of multiplexer 180, however, on FIG. 5 this is indicated as being the UP signal. In fact, this UP signal appears on the output 182 only when multiplexer 180 has switched its I2 input to the output.

Figure 9:
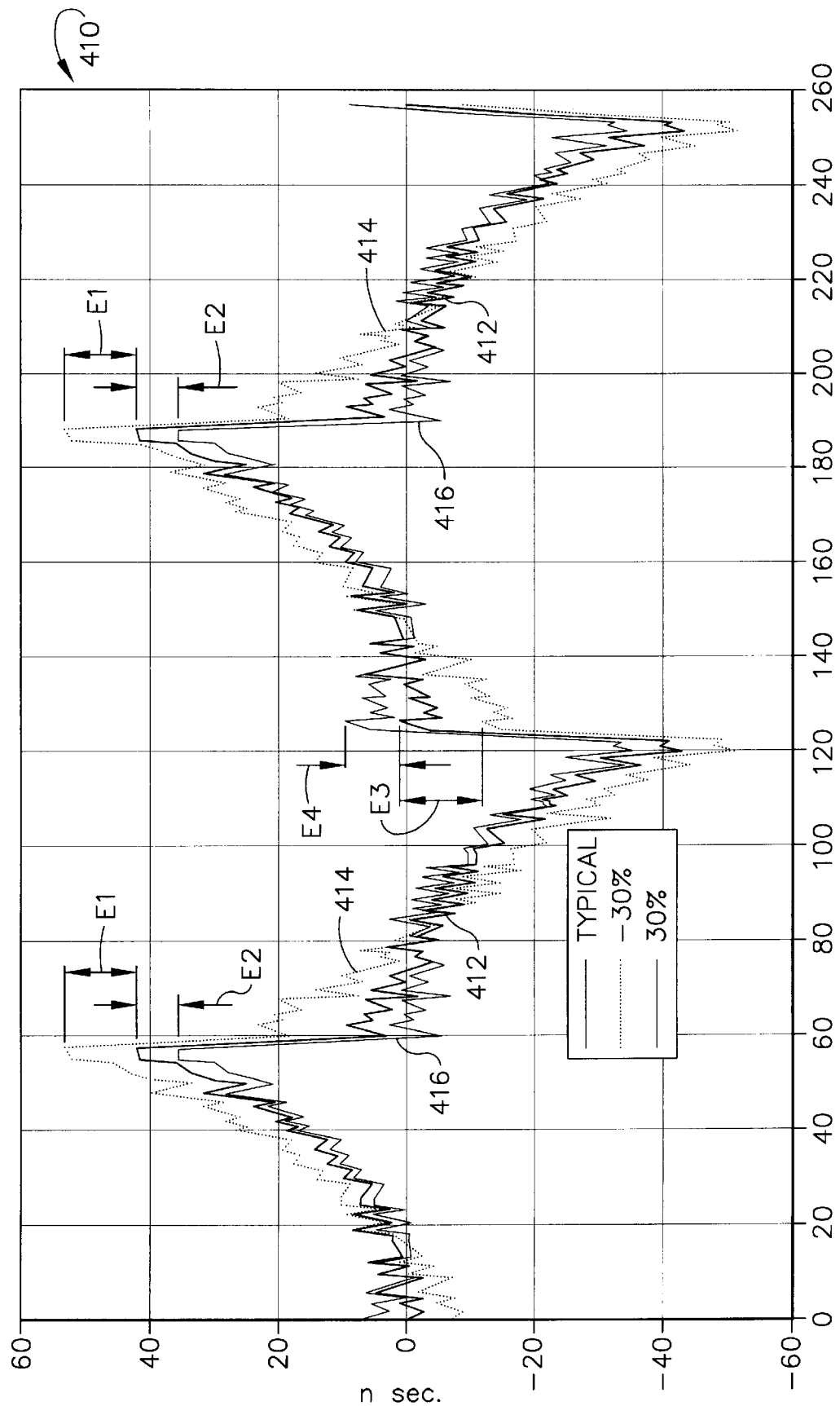
FIG. 9 is a graph of an error profile for UP and DOWN signals used in a spread spectrum clock generator circuit of the present invention, and according to the preferred profile of FIG. 8.

As indicated on FIG. 5, there will be numerous more delay stages in addition to the six delay stages 201–206 depicted on the figure for use with the present invention. FIG. 9 illustrates a graph of a typical "error profile" of the pulse width timings of the UP and DOWN signals 124 and 126, respectively, and it can be seen that the maximum pulse widths for these signals is somewhat greater than forty (40) nanoseconds. FIG. 9 also illustrates cases where the typical pulse width is changed due to variations in component parameters, and so it is important to have a much larger number of delay elements than would be necessary for the "typical" (or nominal) pulse width values. In the preferred embodiment of the present invention, the delay elements 211–216 are chosen to have propagation delays of approximately one (1) nanosecond per delay element, and so for a "typical" maximum pulse width, the designer would only need to include about forty-three (43) or forty-four (44) of these delay stages. In reality, however, there should be at least a 3-times error factor included, which would require over 130 delay stages, and to design conservatively, a small error factor could be added, thereby bringing the total of the delay stages to about 150. And this is a conservative design when the "typical" pulse width is only about forty (40) nanoseconds!

Consequently, it can be seen that a very large number of logic gates will be required to implement the delay chain 200, and this number of gates increases per stage even more when certain complexity is added, as seen below in reference to FIGS. 6 and 7.

Referring back to FIG. 5, as the UP signal propagates through each of the delay elements 211–216, the corresponding flip-flops 221–226 will have their Q outputs set to a Logic 1 in a sequence, starting with the output 231 and propagating through the output 236 and beyond. The longer the pulse width of the UP signal at 182, the more delay stages 201–206 (etc.) will have their flipflop Q outputs set to Logic 1. Each of these flip-flops 221–226 (etc.) includes a "clear" input that is connected to the "Reset" output signal 186 from the controller 190, and also a clock input that is connected to the inverted clock signal of the system.

The delay chain 200 represents a fairly simple detection circuit for detecting the pulse width of the UP or DOWN signals, and will only store data for the most recent such UP or DOWN signal that has been presented to the delay chain circuit 200. It may be desirable to detect the maximum pulse width of the UP signal over several consecutive intervals of the profile, and to determine the value of the maximum or "peak" of these pulse widths. The circuit depicted in FIG. 6 is capable of providing this function, by adding an OR-gate 321 that causes the "D" input to remain at Logic 1 once the Q output of the flip-flop 281 makes a transition to Logic 1 at 291.

Figure 6:
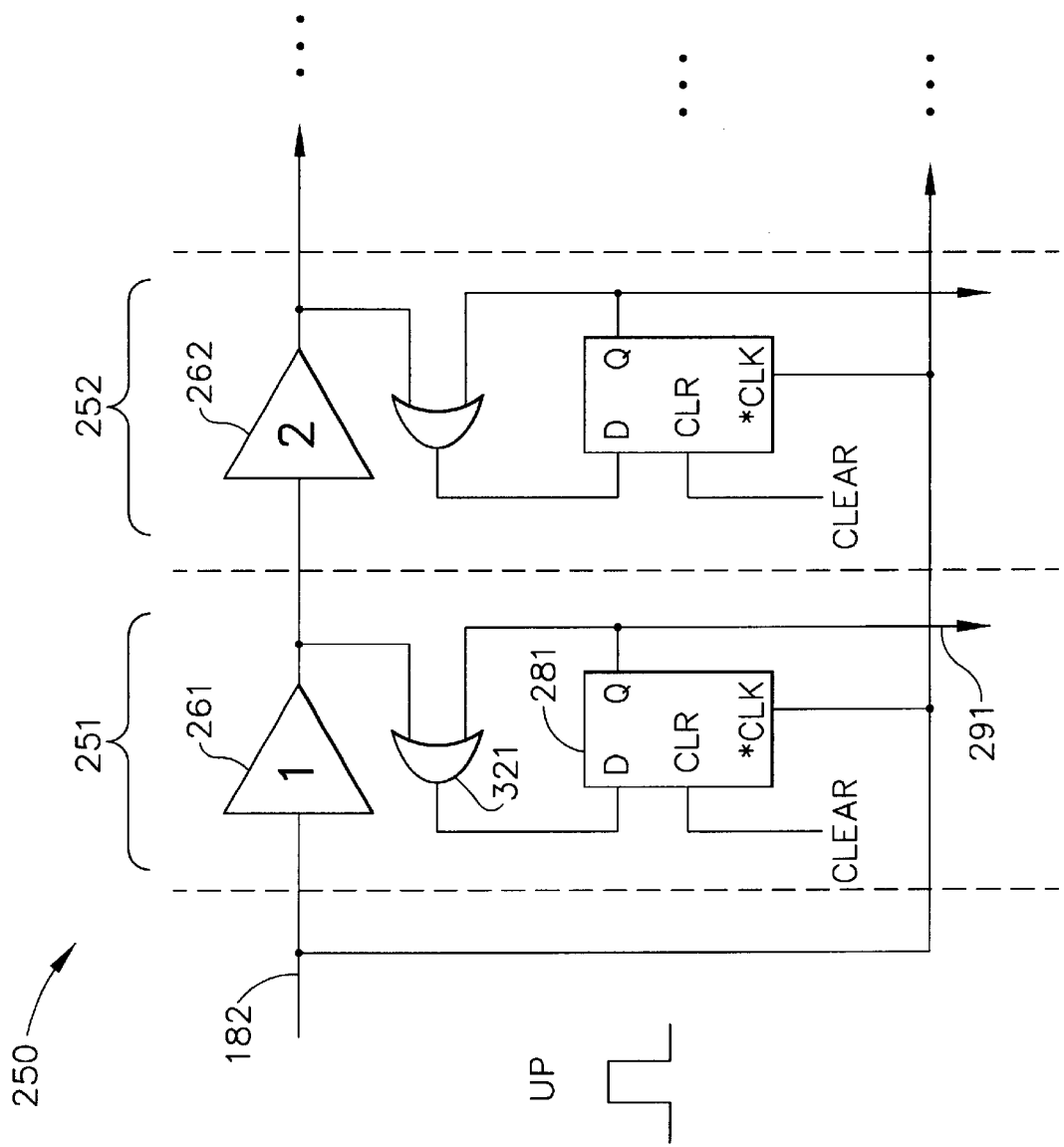
FIG. 6 is a schematic diagram of a second embodiment of an in-series delay chain used in the circuit of FIG. 4.

Since each delay stage 251, 252, etc. contains both a delay element, such as 261, and an associated flip-flop 281 and OR-gate 321, each of the delay stages can "remember" a Logic 1 transition of its Q output of the flip-flop, for the entire delay chain 250 of FIG. 6. If the pulse width of the UP signal at 182 is, for example, forty (40) nanoseconds in duration, then approximately forty (40) delay stages will make a transition to Logic 1. If, for example, the next UP signal pulse width is forty-one (41) nanoseconds in duration, then approximately forty-one (41) delay stages will be sent to Logic 1, which means that an additional delay stage will now make the transition to Logic 1 than had previously occurred. If, for example, the next UP signal pulse width is only thirty-five (35) nanoseconds in duration, then only thirty-five (35) delay stages would have been set to Logic 1 if there was no "peak" memory circuit; however, since the OR-gates are included in FIG. 6, these thirty-five (35) delay elements were already set to Logic 1, and the longer duration of the earlier pulse width causing forty-one (41) delay elements to be set to Logic 1 will be maintained. The consequence is that the longest time duration UP signal pulse width will be remembered by this delay chain circuit 250.

Since the preferred embodiment uses an ASIC for creating the delay elements of all the delay stages, the actual propagation delay for each delay element will not be precisely one (1) nanosecond, but will likely be some other time duration that will be off by a certain percentage from the one (1) nanosecond goal. In view of this minor shortcoming of the use of ASIC logic elements, it is preferred to calibrate the delay chain, which can be accomplished by use of the circuit depicted in FIG. 7.

Figure 7:
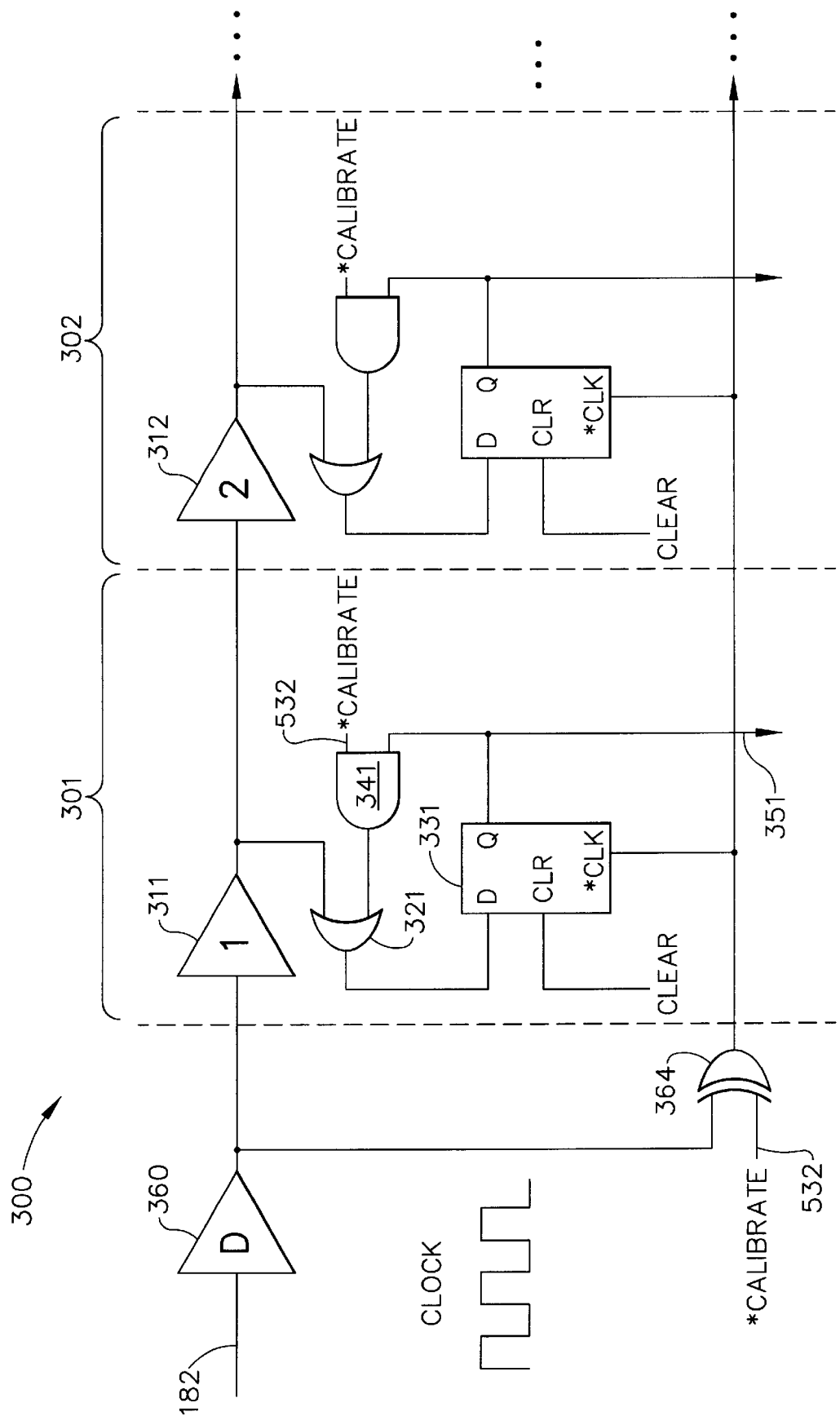
FIG. 7 is a schematic diagram of a third embodiment of an in-series delay chain used in the circuit of FIG. 4.

In FIG. 7, the output 182 of multiplexer 180 is directed to a delay element 360, which provides a several nanosecond delay that, while not necessarily very accurate, at least will be fairly repeatable. This delay stage 360 can be eliminated if it turns out not to be desirable for its inclusion in the circuit 300. However, if attempting to measure the maximum or "peak" pulse width of the UP and DOWN signals, then it may be very beneficial to include this delay element 360 by having its delay timing of about ten (10) to twenty (20) nanoseconds, thereby saving an equivalent number of delay stages (e.g., the delay elements 301 and 302 in FIG. 7). It should be noted that the propagation time of the delay element 360 must never be longer than the shortest pulse that is to be measured.

Once the clock signal is presented to delay stage 360, after that stage's propagation delay time, the clock signal will then be presented to the delay chain 300, starting with its first delay element 311, and then on to the next delay element 312, etc. By using an OR-gate 321, the Q output 351 of the associated D flip-flop 331 will be latched to Logic 1 until a "clear" or "Reset" signal 186 is sent from the controller 190. Alternatively, a "Calibrate" signal can be sent to also reset or clear all of the flip-flops in the delay chain 300. This Calibrate signal in an inverted form at 532 is sent to an AND-gate 341, which is in series with the latching circuit that includes the OR-gate 321. Furthermore, an Exclusive OR-gate 364 is also included to receive the inverted calibrate signal (also called the NOT calibrate signal) 532.

The NOT calibrate signal 532 is set to Logic 1 when the delay chain 300 is attempting to find the maximum (or peak) pulse width of the UP or DOWN signals, or in other words, while it is "accumulating" this data The NOT calibrate signal 532 is set to Logic 0 during an actual calibration operation, which means that the delay chain 300 is not accumulating any data, and the clock signal will be presented to the delay stage 360. This NOT calibrate signal 532 is a logically inverted signal with respect to the "Mode" signal 188, which is depicted as an output from the controller 190 on FIG. 4.

The Exclusive OR-gate 364 switches which edge of the clock (or other pulse signal) that is to be the trigger with respect to the operation of the D flip-flops of the delay chain 300, such as flip-flop 331. As in the previously-described delay chain circuits 200 and 250, each D flip-flop has a clear input that is connected to the Reset signal 186, and also has an inverted clock input. By use of all of the gates and the delay stage 301, it can be seen that delay chain 300 can work as both a peak detection circuit or as a "simple" detection circuit (by which it would not accumulate pulse width data from one cycle to the next). Furthermore, it can now be seen that there are several logic gates required for each delay stage, and well over 1,000 logic gates would be necessary to provide a delay chain of at least 150 stages. In view of that fact, it may be desirable to use a different interval of the profile for determining the error in the UP or DOWN pulse widths, which will be described hereinbelow.

Referring now to FIG. 8, a graphical representation 400 of a simulated target profile and an actual profile are depicted. The simulated (or predetermined) target profile is depicted by the curve 402, whereas the actual spread spectrum profile is depicted by the rather jagged curve 404. As discussed hereinabove, the illustrated profile is a preferred embodiment of a spread spectrum clock generator that runs between 48.25 MHz and 50 MHz, which presents a very low noise signature with respect to electromagnetic interference emissions.

The first period illustrated on FIG. 8 is generally designated by the reference numeral 406, which begins at the lowest frequency (i.e., around 48.25 MHz), then moves upward to a maximum peak of about 50.00 MHz, and then quickly falls back to a minimum valley of about 48.25 MHz at the end of this period 406. An identical pattern then repeats for the next period, as generally designated by the reference numeral 408; and this pattern continues for as long as it is desirable to run the system clock in this frequency range. Each profile period (e.g., period 406) requires approximately 32 microseconds, and each profile period utilizes 128 different intervals during which the value for N in the N counter 138 is held constant for each of these intervals. Upon reaching the end of an interval, the value for N is changed, or alternatively the charge pump current amplitude could be changed by a signal 192 from the controller 190. In the preferred embodiment, however, the address counter 150 looks up a different table value in the table 154, which then provides a new value for N in the N counter 138.

In view of the fact that there are 128 intervals of equal duration, each interval is approximately 250 nanoseconds in duration. There will be up to a total of 128 UP or DOWN pulses per modulating profile. One would expect the widest pulse width and maximum number of UP or DOWN pulses to occur at the beginning of an interval, when the Phase Locked Loop circuit is attempting to shift its frequency output of the VCO 134 the fastest.

Referring now to FIG. 9, a graph 410 is provided showing typical and ±30% tolerance values for the pulse width of the UP or DOWN pulses that are generated by the PFD 122. As can be seen on FIG. 9, the "typical" graph 412 exhibits its maximum or "peak" values for the pulse width of the UP or DOWN signals very close to (i.e., just before) the "peak" maximum or minimum frequency values of the simulated profile target curve 402 on FIG. 8. This means that, as the frequency is increasing and suddenly begins decreasing (i.e., in which there is a significant change in slope of the curve 402), the UP or DOWN pulse widths change dramatically in magnitude, and this occurs before the "error profile" interval 64 on the graph 410. Since the frequency has been increasing and suddenly wants to start decreasing according to the target profile (i.e., because the actual spread spectrum profile curve 404 is attempting to emulate the predetermined target profile curve 402), the PDF circuit 122 begins outputting DOWN pulses at 126 to the charge pump 128. The maximum duration of these DOWN pulses is approximately forty-two (42) or forty-three (43) nanoseconds. This occurs approximately half-way through the period of the simulated profile curve 402 on FIG. 8.

When the minimum "valley" occurs on the target curve 402, the frequency has been decreasing and suddenly begins increasing rather sharply. When this occurs, the PFD circuit 122 begins outputting UP pulses at 124 through the charge pump 128. This is indicated on FIG. 9 at approximately the interval 127 or 128, and the UP pulse width is approximately 40 nanoseconds (which shows as −40 nsec on the graph 410).

On graph 410, the curve 414 represents the pulse width timings at the various intervals across the profile when the effective PLL parameter gain is approximately 30% lower than typical. The curve 416 is a plot of the UP and DOWN pulse widths when the effective PLL parameter gain has increased to approximately 30% above typical. At the first positive "peak," which occurs at the maximum pulse width shortly before the interval 64, the magnitude of the error difference is fairly large between the typical curve 412 and the ±30% tolerance curves 416 and 414, respectively. On the graph 410, the error between the typical curve 412 and the −30% curve 414 is designated as "E1." The error difference between the typical curve 412 and the +30% curve 416 is designated as "E2." This type-E1 and -E2 error difference pattern repeats at the next profile, which can be viewed near the interval 190 on FIG. 9.

It is relatively simple to detect the "peak" pulse width by use of the delay chain depicted on FIG. 7, which not only stores the maximum pulse width of the UP or DOWN signals, but which also can be calibrated by the system clock so that the actual time duration (in real time) can be measured for each of these pulse widths. Therefore, the measured (actual) maximum pulse width of the DOWN signal can be compared to the desired typical value of about 42 or 43 nanoseconds.

The greater the magnitude of error deviation for either E1 or E2, the greater the correction that needs to be made to the charge pump current or the value for N in the N counter 138. As stated above, it is preferred to control the charge pump current magnitude by the signal 192 that is provided by the system controller 190. Either the processing circuit or the "all-electronic solution" circuit that provides a State Machine (see FIG. 10) can automatically change the charge pump current so as to reduce the error in the appropriate direction and by the appropriate magnitude, thereby compensating for any component deviations in the electronic circuitry of the PLL circuit.

It is important to choose an interval within the profile that provides a relatively large error between the typical error profile curve and the tolerance curves, so that it will be relatively easy to measure and compensate for operating errors in the typical value. While the "peak" value at around interval 63 or 64 (of 128) can be used and is relatively simple to detect, the measurement of this "peak" pulse width value for the UP and DOWN signals will require a very long delay chain having many gates for its delay stages, as discussed hereinabove.

In view of the long delay chain required to measure the maximum (accumulated) pulse width of the UP and DOWN signals, there could be some benefit in choosing a portion of the error curve on the graph 410 that has a shorter time duration for the UP and DOWN pulses, yet still provides a sufficient error difference between the typical curve and the tolerance curves, assuming such a location can be found on the graph 410. It turns out that there is a significant error deviation between the typical curve and tolerance curves at around the interval 128, and these errors are depicted as "E3" and "E4" on FIG. 9, which are exhibited just after the spread spectrum profile changes from a decreasing frequency to an increasing frequency (i.e., which occurs as a significant change in the target profile curve's slope) at around the thirty-two (32) microsecond time mark (in the example of FIG. 9). In addition, a similar "mirror image" set of similar error deviations occur around the interval 64 (on FIG. 9), in which about the same magnitude of error is exhibited between the typical curve and the tolerance curves, but in the opposite direction (i.e., along the Y-axis of this graph). These E3- and E4-type error deviations also repeat during the next profile (e.g., at around the profile intervals 192 and 256 on FIG. 9).

While the "peak" (or maximum) pulse width would not be useful as a criterion in finding these errors E3 and E4, a much shorter delay chain could be used, since the typical pulse width time is less than ten (10) nanoseconds at this interval on the profile. As can be seen from the graph 410, the −30% curve 414 exhibits a value of around +10 nanoseconds, while the −30% curve 414 exhibits a value of around −18 nanoseconds (keeping in mind that, of course, time is an absolute value, and these plus and minus values on the graph are merely relative timing values where DOWN is plus and UP is minus).

If the sampling circuit is used in the instantaneous mode only, and the interval of 128 (for this example, that is) is always used to select the measured value of the UP or DOWN signals, then a substantial error signal can be found for use in automatically compensating for variations in the PLL parameter gains. In this situation, the delay chain 200 on FIG. 5 could be used. Alternatively, the delay chain 300 on FIG. 7 could be used, although it would not be desirable to include the OR-gate 321 at the input to the D flip-flop 331, thereby making this into an instantaneous measuring circuit instead of a "peak" measuring circuit for the pulse width duration.

Figure 10:
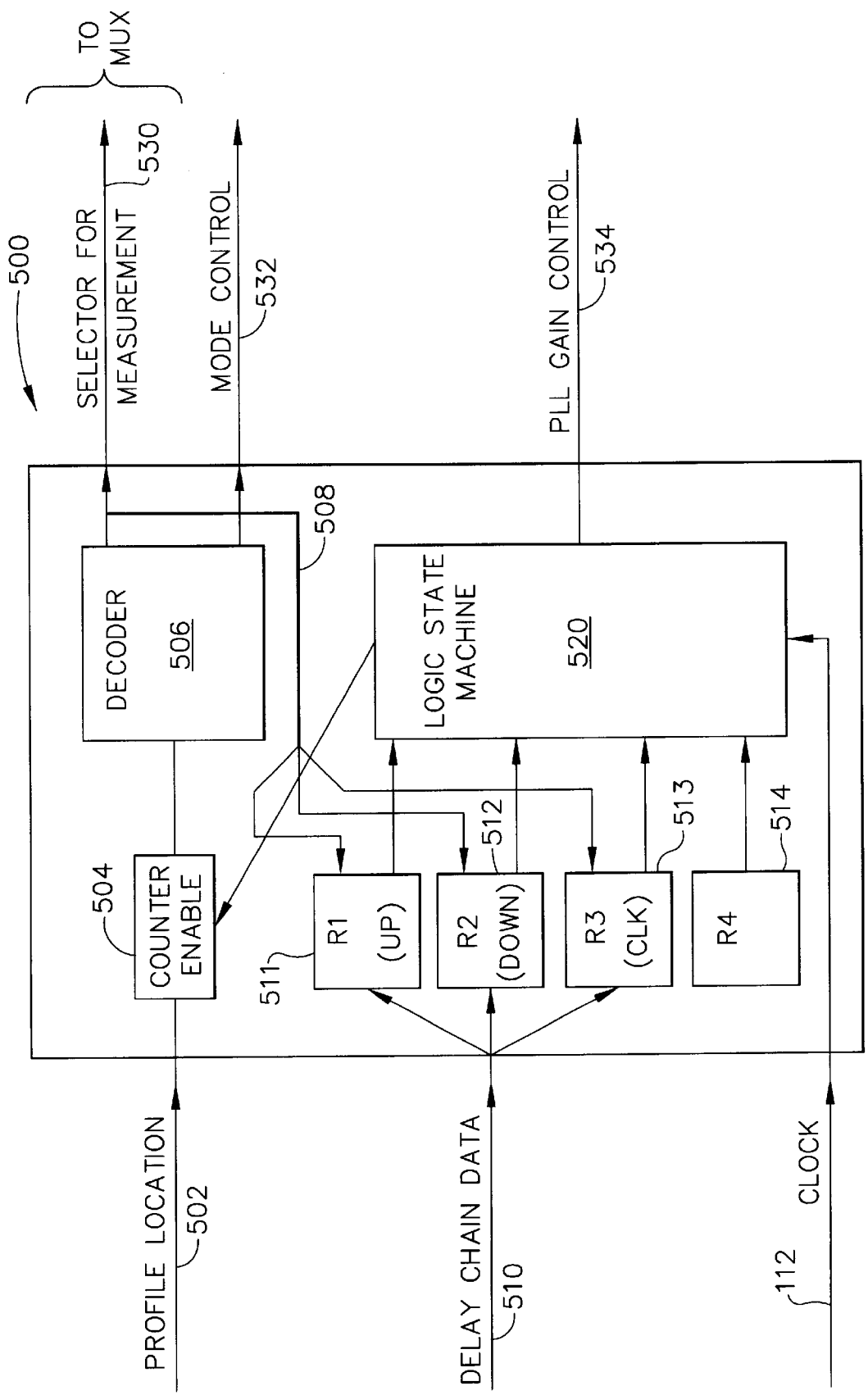
FIG. 10 is a block diagram of an all-electronic solution using a Logic State Machine rather than a microprocessor, as constructed according to the principles of the present invention.

Referring now to FIG. 10, an "all-electronic solution" embodiment of the controller is generally designated by the reference numeral 500. A signal indicating the current profile location (i.e., the interval within the profile of FIG. 8) is provided as an input at 502 to a counter enable circuit 504. A Logic State Machine 520 controls the counter enable circuit 504 and essentially informs the counter when to start, since it is undesirable to attempt to measure the pulse width of the UP and DOWN signals at the same time the system is attempting to control the gain of the PLL circuit.

The output of the counter enable circuit 504 is provided to a decoder circuit 506, which in turn provides an output to the multiplexer at 530. This signal 530 is used to select which input of the multiplexer is connected to its output In addition, decoder 506 outputs three separate enable lines, depicted as a group at 508, that enable registers "R1" at 511 , "R2" at 512, and "R3" at 513.

A mode control signal 532 is also output from decoder 506, and this signal is used on FIG. 7 to either calibrate the delay chain 300, or to take measurements in an accumulating mode to find the maximum or "peak" pulse width of either the UP signal or the DOWN signal. This mode control signal 532 is similar to the mode signal 188 on FIG. 4. In addition, the profile location signal 502 is similar to the profile location signal 170 on FIG. 4.

Data from the delay chain 300 is provided as a signal 510 to the registers R1, R2, and R3. This delay chain data 510 is in the form of a rather long digital (or binary) signal that indicates how many delay elements 301, 302, etc. made a logic transition during either the UP pulse, DOWN pulse, or clock period. At the appropriate time, the delay chain data is provided to register R1 at 511, and this is for the UP signal 124 of FIG. 3. When it is appropriate for the UP pulses to be measured, the multiplexer 180 will select the UP pulse input (I2 on FIG. 4) to be directed to its output, and that output signal 182 will be input to the delay chain 300. The output data from the delay chain will be directed to the registers 511–513, however, at the same time decoder 506 will enable the appropriate line at 508 to allow register R1 to receive this delay chain data The other two registers R2 and R3 will not accumulate data at this time (as they are not enabled).

When it is appropriate to measure the DOWN pulses, the multiplexer 180 will select its I3 input to receive the DOWN signals at 126 and output them at the signal 182 on FIG. 4. This will be provided to the delay chain 300 (at the delay gate 360) so that the delay chain data 510 will consist of the digital (or binary) data relating to the number of delay elements 302, etc. of delay chain 300 that make a logic transition during a pulse of the DOWN signal 126. At the same time, decoder circuit 506 will enable the R2 register to accept this data via the enable line 508.

When it is appropriate to accept clock information from the delay chain, multiplexer 180 will provide the input signal at its input I1 to be directed to its output at 182, which is then provided to the input of the delay chain 300 at the first delay gate 360 on FIG. 7. The delay chain data at 510 will then be provided to the register R3, and at the same time the decoder circuit 506 will enable register R3 via its enable line at 508.

The form of the digital or binary data that is loaded into registers R1, R2, and R3 is provided below as Table #1:

520. After the Logic State Machine 520 has analyzed this data, adjustments may be made to the PLL gain by use of a gain control signal at 534, which is output from the Logic State Machine 520. This gain control signal could be used to adjust either the charge pump current or the VCO gain, although it is preferred that it be used to adjust the charge pump current, which would be a signal similar to the signal 192 on FIG. 3 that is output from the controller 190. In many ways, the circuit 500 of the all-electronic solution on FIG. 10 is very similar to the controller 190 of FIG. 4. The main difference is that the all-electronic solution does not necessarily require a sequential processing unit such as a microprocessor, whereas the controller 190 as disclosed herein is generally expected to include a microprocessor-type circuit to provide the main intelligence of the system.

A computer program can be created to perform certain functions, as described below, in a predetermined order to adjust the profile due to variations in the system. One such function is to decide when it is appropriate to check and adjust the system. Examples of when to adjust system operating parameters would be when first applying power, or after a temperature change due to system self-heating or due to ambient temperature changes. Another function would be to measure the maximum or instantaneous UP and DOWN pulse widths and the calibration clock signal. From this data, an accurate time can be calculated for the UP and DOWN pulse widths by interpolating between the PFD outputs and the clock delays. Another function would be compare the actual UP and DOWN times to the predetermined time and tolerance. This comparison will result in an error figure that can be used to adjust the controls in a predetermined way. Yet another function would be to repeat the above functions at some predetermined intervals.

As noted hereinabove, if the physical characteristics of the components used in a particular circuit design are sufficiently stable and repeatable, then the spread spectrum clock generator could be set up in a production line environment and, once the set-up is completed, will continue to operate during run time at a customer's site in a manner that continually compensates for the circuit operating parameters. Since these initial operating parameters will not appre-

TABLE 1

| |
|---|
| 11111111111111111111111111110000000000000000000000001111111 = UP = R1 |
| 11111111111111111111111111100000000000000000000000001111111 = DOWN = R2 |
| 111110000011111000001111100000111110000011111000001111100+CLK = R3 |
| R4 contains the target time in Reference clocks for the UP and/or DOWN, with tolerance. |

NOTES:
The first group of consecutive binary 1's in R1 represent the "peak" length of UP in delay stages.
The first group of consecutive binary 1's in R2 represent the "peak" length of DOWN in delay stages.

A fourth register "R4" is depicted on FIG. 10 at 514. This register contains the "target" (or typical) maximum (or "peak") pulse width time for the UP and DOWN signals, and also includes a tolerance to be expected. This information could be in two different forms: (1) a center target time with a plus and minus deviation or tolerance, or (2) the upper limit tolerance and the lower limit tolerance. In the preferred embodiment, the center target time with a plus and minus deviation is preferred.

At the appropriate moment (which will be described in connection with the flow charts on FIGS. 11–14), the data contained within the registers 511–514 will be virtually simultaneously transferred onto the Logic State Machine ciably change over long periods of time (or perhaps will never appreciably change), constant re-calibration (or set-up) is not necessary. If the components are such quality that only a single set-up is ever required, then the production line station acts in a "manual mode" to set up the spread spectrum clock generator, in which the spread spectrum clock generator is tested to determine the initial values of VCO gain, charge pump current, and passive component values (i.e., when using a Phase Locked Loop circuit implementation).

Another implementation of the present invention would be to operate the spread spectrum clock generator in an "automatic mode" as described above. In one circumstance, the measurement and associated calibration of the Phase Locked Loop parameters takes place almost continuously, and the actual pulse-width durations are compared every profile to typical or to predetermined values, and the system operating parameters are quickly varied during run time to correct any deviation error.

In another circumstance, the measurement and associated calibration of the Phase Locked Loop parameters takes place at fairly infrequent time intervals, such as one day, or even annually. In this embodiment, the spread spectrum clock generator circuit is made of components that have parameters that are sufficiently repeatable to justify "automatic mode" acalibration procedures only at very long time intervals (e.g., up to an entire year).

An exemplary generic computer program is provided below for embodiments of the present invention that contain a central processing unit. The steps performed by this computer program correspond very closely to the steps indicated in the flow charts of FIGS. 11–14, although this set of flow charts is more specifically aimed at the all-electronic solution using a Logic State Machine. The generic computer program follows immediately below, as Table #2, which is in the form of pseudo code:

TABLE 2

| Line | Program Statement | Comment Field |
|---|---|---|
| 1 | CLK_COUNT=0 | How many clock periods have been traversed |
| 2 | CLK_PERIOD=1 | How many delays are running in current since last clock rise |
| 3 | UP_CLK=0 | How many clock rises have been traversed until UP delay is met |
| 4 | UP_REMAINDER=0 | How many delays for UP since last clock rise |
| 5 | UP_CLK_PERIOD=0 | How many delays between adjacent clock edges that UP occurred |
| 6 | DOWN_CLK=0 | How many clock rises have been traversed until DOWN delay is met |
| 7 | DOWN_REMAINDER=0 | How many delays for DOWN since last clock rise |
| 8 | DOWN_CLK_PERIOD=0 | How many delays between adjacent clock edges that DOWN occurred |
| 9 | LAST_CLK=1 | Status of previous clock |
| 10 | if(UP_CLK_PERIOD<>0 and DOWN_CLK_PERIOD<>0) then STOP State machine and go to DO CALCULATIONS | |
| 11 | if UP=0 and UP_CLK=0 and UP_REMAINDER=0) then UP_CLK=CLK_COUNT and UP_REMAINDER=CLK_PERIOD | |
| 12 | if (DOWN=0 and DOWN_CLK=0 and DOWN_REMAINDER=0) then DOWN_CLK=CLK_COUNT and DOWN_REMAINDER=CLK_PERIOD | |
| 13A | if((UP_CLK<>0 or UP_REMAINDER<>0) and LAST_CLK=0 and CLK=1) then UP_CLK_PERIOD=CLK_PERIOD | |
| 13 | if((DOWN_CLK<>0 or DOWN_REMAINDER<>0) and LAST CLK=0 and CLK=1) then DOWN_CLK_PERIOD=CLK_PERIOD | |
| 14 | if(LAST_CLK=0 and CLK=1) THEN++CLK_COUNT and CLK_PERIOD=0 else ++CLK_PERIOD | |
| 15A | LAST_CLK=CLK | |
| 15 | shift one to left | |
| 16 | go to 10 | |
| 70 | //DO CALCULATIONS    To Get Target | |
| 74 | TARGET_CLK=1 | |
| 75 | TARGET_FRACTION=0.2 | |
| 76 | TARGET_REMAINDER=floor(TARGET_FRACTION*UP_CLK_PERIOD+0.5) | |
| 77 | TARGET_TOLERANCE=1 | |
| 78 | TARGET_DELAYS=UP_CLK_PERIOD*TARGET_CLK+TARGET_REMAINDER | |
| 79 | UP_DELAYS=UP_CLK_PERIOD*UP_CLK+UP_REMAINDER | |
| 80 | if(TARGET_DELAYS-TARGET_TOLERANCE<UP_DELAYS) | |
| 81 | { | |
| 82 | //Increase UP charge pump current | |
| 83 | //Read the Delay registers again | |
| 84 | //Go to start | |
| 85 | } | |
| 86 | if(TARGET_DELAYS+TARGET_TOLERANCE>UP_DELAYS | |
| 87 | { | |
| 88 | //Decrease UP charge pump current | |
| 89 | //Read the Delay registers again | |
| 90 | //Go to start | |
| 91 | } | |
| 92 | TARGET_DELAYS=DOWN_CLK_PERIOD*TARGET_CLK+TARGET_REMAINDER | |
| 93 | DOWN_DELAYS=DOWN_CLK_PERIOD*DOWN_CLK+UP_REMAINDER | |
| 94 | if(TARGET_DELAYS-TARGET_TOLERANCE<DOWN_DELAYS) | |
| 95 | { | |
| 96 | //Increase DOWN charge pump current | |
| 97 | //Read the Delay registers again | |
| 98 | //Go to start | |
| 99 | } | |
| 100 | if(TARGET_DELAYS+TARGET_TOLERANCE>DOWN_DELAYS) | |
| 101 | { | |
| 102 | //Decrease DOWN charge pump current | |
| 103 | //Read the Delay registers again | |
| 104 | //Go to start | |
| 105 | } | |
| 106 | //Both the UP and DOWN are now adjusted | |

It should be noted that, in reference to the above-computer program, the number of clock rises in line 3 are calculated in terms of clock periods. The same is true for the number of "clock rises" that are calculated in line 6. It should be further noted that the number of "delays" that are calculated in line 2 refer to the number of delay stages that have made a transition. The same is true for the number of "delays" that are referred to in lines 4, 5, 7, and 8. It should be noted with regard to line 9 that the status of the "previous clock" refers to the status as of the last gate delay interval.

With regard to the Logic State Machine as depicted on FIG. 10, the basic functions to be performed are the same as performed by the computer program, but the implementation is minimized due to the desire to limit the logic gate count needed in the Logic State Machine design. Similar calculations can be made by shifting bits or counting and using lookup tables to perform interpolations.

Figure 11:
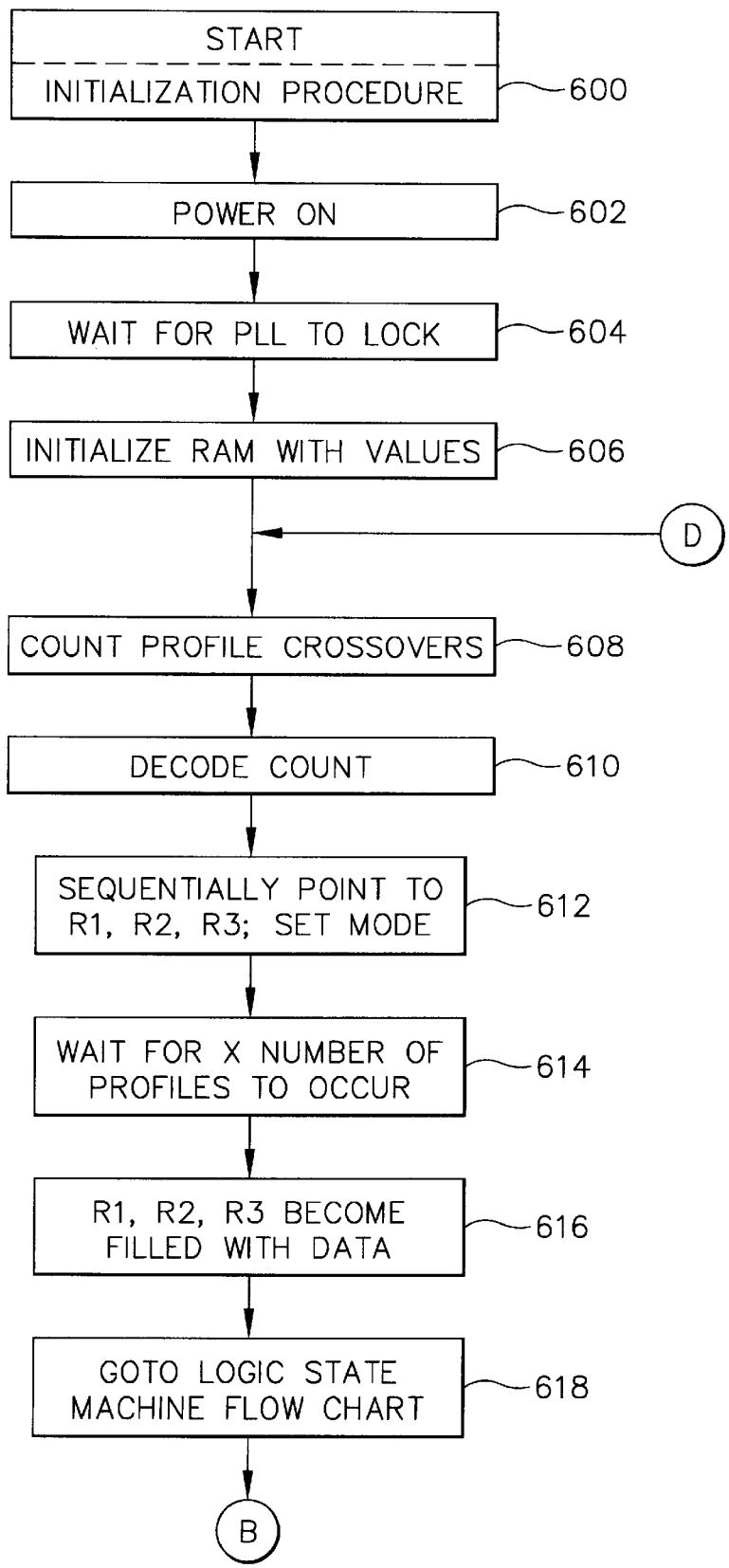
FIGS. 11–14 are a flow chart of the functional steps performed by the Logic State Machine of FIG. 10.

With regard to the Logic State Machine embodiment as depicted on FIG. 10, FIG. 11 depicts the logic flow of the initial steps taken by the Logic State Machine 520. Starting with the initialization procedure at a step 600, the logic flow begins with a power ON condition at 602, then a short waiting period needed for the Phase Locked Loop to lock at its initial operating frequency, at a step 604. This waiting step 604 can take two different forms: (1) the State Machine can wait for a rather lengthy time period, after which the PLL should be guaranteed to have been locked, or (2) if a hardware output signal is available from a particular PLL circuit, that signal will indicate when the locked condition exists.

At a step 606, certain areas in RAM are initialized with appropriate values. After that has occurred, a step 608 counts a particular number of profile crossovers, which occur, for example, on FIG. 9 at approximately the intervals 64, 128, 192, and 256. At a step 610, the count is decoded (essentially by the decoder circuit 506). After that has occurred, a step 612 sequentially points to the registers R1, R2, and R3 (i.e., registers 511–513), and while this occurs, the mode is set using the mode control signal 532. This mode, of course, allows data to be accumulated into the registers R1, R2, and R3.

At a step 614, the Logic State Machine waits for a predetermined number of profiles to occur, during which the registers R1, R2, and R3 become filled with data at a step 616. After that has occurred, a step 618 directs the logic flow to the letter "B" on FIG. 12. It should be noted that this procedure is followed over and over during the operation of the PLL within the spread spectrum clock generator, and certain of these "initialization" steps are repeated, starting with the step 608, as indicated by the incoming logic flow returning from a letter "D" on FIG. 14. The functions of these steps on FIG. 11 essentially correspond to the first nine steps of the computer program provided hereinabove.

Figure 12:
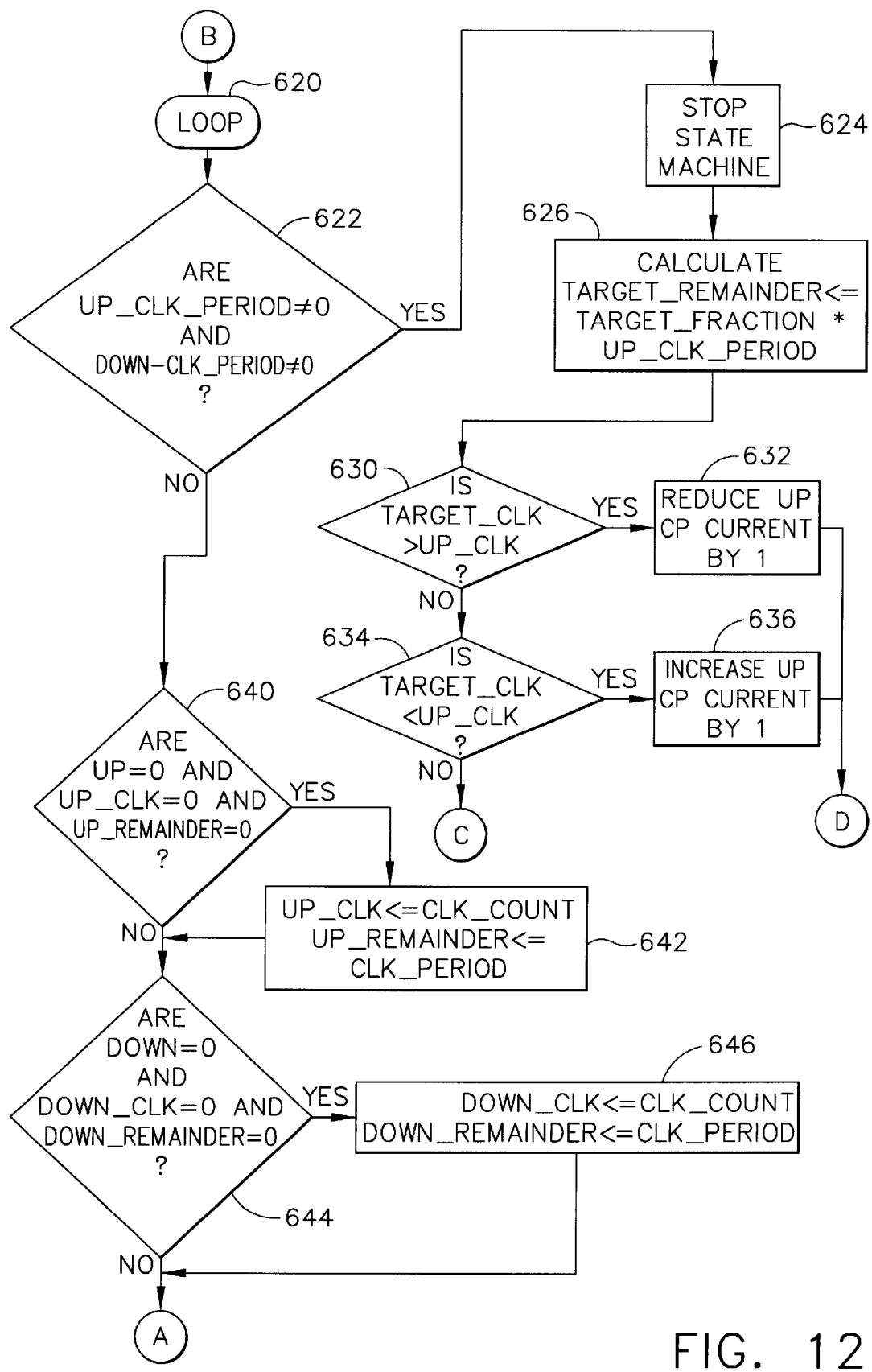

Referring to FIG. 12, starting at "B," the logic flow is directed to a "loop" indicator at 620, which then directs the logic flow to a decision step 622, where it is determined if the variable UP_CLK_PERIOD is not equal to zero (0) and if the variable DOWN_CLK_PERIOD is not equal to zero (0). If the answer at decision step 622 is YES (for all of these above conditions), a step 624 stops the Logic State Machine and a step 626 performs a calculation. At step 626 the variable TARGET_FRACTION is multiplied times the variable UP_CLK_PERIOD, and the result is placed into a variable named TARGET_REMAINDER. After this calculation is performed at step 626, a series of logical decisions is made that will result in either reducing or increasing the charge pump current. These steps will be discussed in greater detail below.

Returning to the decision step 622, if the result was NO, a decision step 640 determines if the variable UP is equal to zero (0), and the variable UP_CLK is equal to zero (0), and the variable UP_REMAINDER is equal to zero (0). If the answer is YES (for all of these above conditions), then a step 642 will load the value of the variable CLK_COUNT into the variable UP_CLK, and the value of the variable CLK_PERIOD is loaded into the variable UP_REMAINDER.

The logic flow is now directed to a decision step 644 from both the step 642 and from the NO result of decision step 640. At decision step 644, it is determined if the DOWN signal is equal to zero (0), and if the variable DOWN_CLK is equal to zero (0), and if the variable DOWN_REMAINDER is also equal to zero (0). If the answer is YES for all these conditions, then a step 646 loads the contents of the variable CLK_COUNT into a variable DOWN_CLK and the value of the variable CLK_PERIOD is loaded into a variable DOWN_REMAINDER. Once this has been done, the logic flow is directed to the letter "A" from both step 646 and from the NO result of decision step 644.

It should be noted that decision step 622 is essentially the same as line 10 of the above computer program, decision step 640 is essentially the same as line 11 of the computer program, and decision step 644 is essentially the same as line 12 of the computer program.

Figure 13:
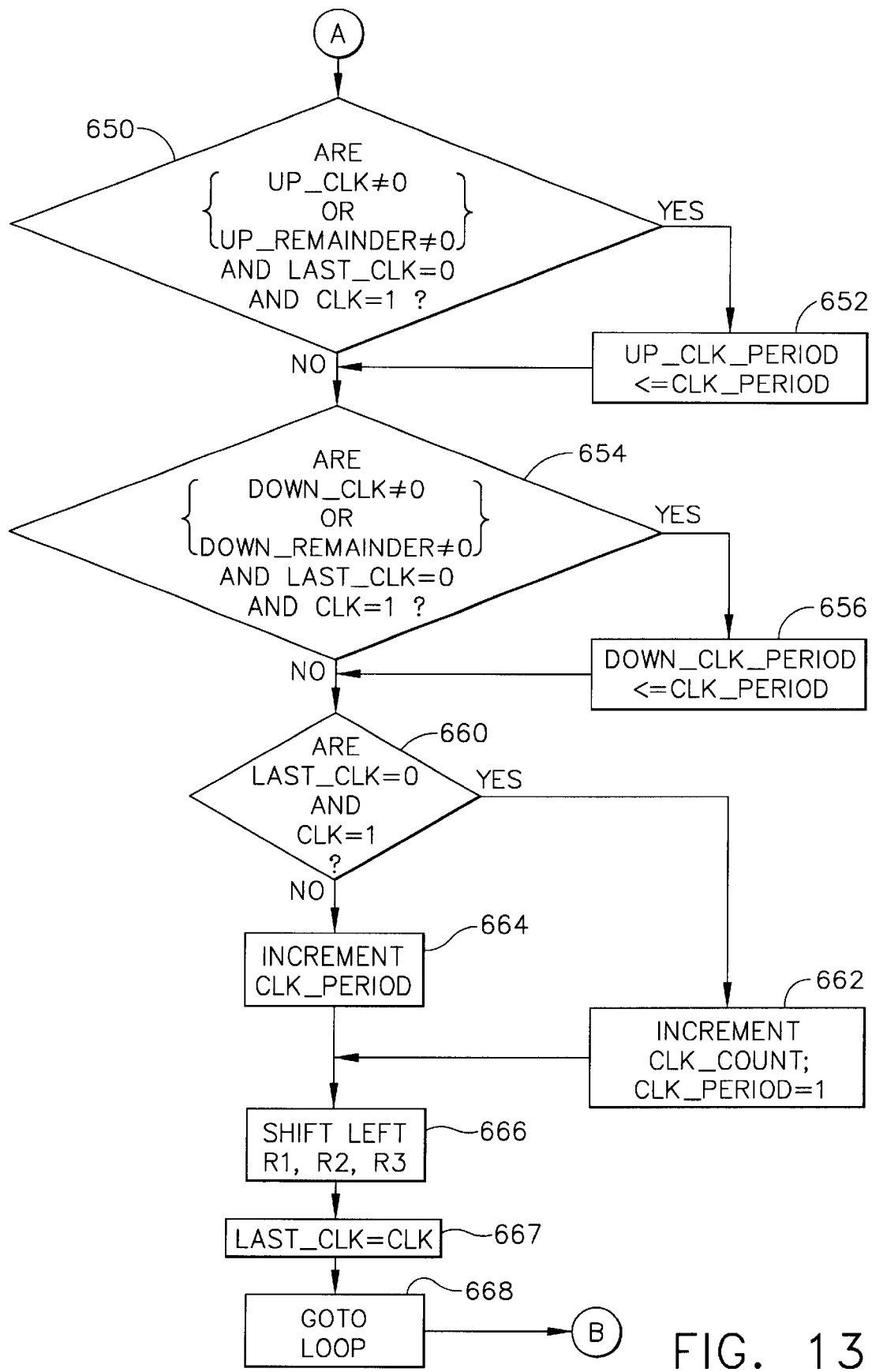

The logic flow continues on FIG. 13 from the letter "A,", and is directed to a decision step 650 where it is determined if the variable UP_CLK is not equal to zero (0) or the variable UP_REMAINDER is not equal to zero (0), and that quantity is logically ANDed with whether or not the variable LAST_CLK is equal to zero (0) and the CLK signal is equal to one (1). If the answer is YES for all these conditions, then a step 652 will load the value of the variable CLK_PERIOD into the variable UP_CLK_PERIOD. The logic flow is now directed to a decision step 654 from both step 652 and the NO result of decision step 650.

At decision step 654 it is determined if the variable DOWN_CLK is not equal to zero (0) or the variable DOWN_REMAINDER is not equal to zero (0), and that quantity is logically ANDed with whether the variable LAST_CLK is equal to zero (0) and if the CLK signal is equal to one (1). If the answer is YES for all these conditions, then a step 656 loads the current value of the variable CLK_PERIOD into the variable DOWN_CLK_PERIOD. The logic flow is now directed from both step 656 and the NO result of decision step 654 to a decision step 660.

Decision step 660 determines if the variable LAST_CLK is equal to zero (0) and if the CLK signal is equal to one (1). If the answer is YES, a step 662 will increment the variable CLK_COUNT, and will set the variable CLK_PERIOD to one (1). If the result at 660 is NO, a step 664 will increment the CLK_PERIOD variable, but will do nothing else.

The logic flow is now directed from both steps 662 and 664 to a step 666 which shifts left all three registers R1, R2, and R3. After that occurs, a step 667 sets the variable LAST_CLK equal to the current value of CLK, and a step 668 goes back to the "loop" step, which is located at the letter "B" both on FIG. 13 and on FIG. 12.

Decision step 650 is essentially performing the function of the line 13A of the above computer program, and decision step 654 is essentially performing the line 13 of the above computer program. The decision step 660 is essentially performing the line 14 of the above computer program.

Now returning to FIG. 12, the logic flow is directed from step 626 to a decision step 630 where it is determined if the variable TARGET_CLK is greater than the variable UP_CLK. This essentially is the same as the line 30 of the above computer program. If the answer is YES, the UP charge pump current is reduced by one (1) at a step 632. Once that occurs, the logic flow is directed to a letter "D" which takes the logic flow back to the step 608 on FIG. 11.

If the result is NO for decision step 630, then a decision step 634 determines if the variable TARGET_CLK is less than the variable UP_CLK. If the answer is YES, then the UP charge pump current is increased by one (1) at a step 636, and the logic flow is directed to the letter "D." If the result is NO for decision step 634, then the logic flow is directed to the letter "C" which directs the logic flow over to FIG. 14.

Figure 14:
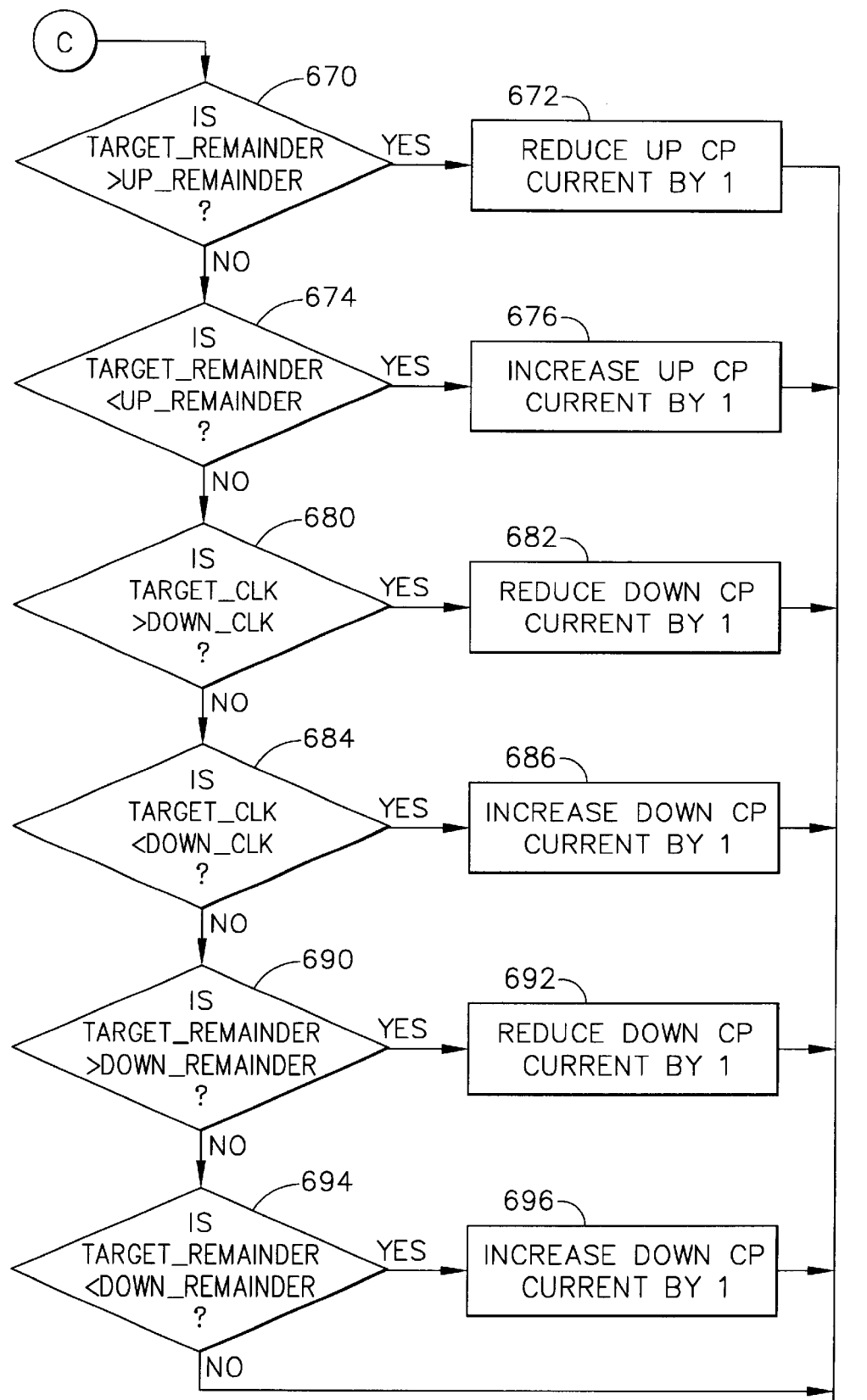

Starting at letter "C" on FIG. 14, a decision step 670 determines if the variable TARGET_REMAINDER is greater than the variable UP_REMAINDER. If the answer is YES, then the UP charge pump current is reduced by one (1) at a step 672, after which the logic flow is directed to letter "D." If the answer is NO at decision step 670, then a decision step 674 determines if the TARGET_REMAINDER variable is less than the UP_REMAINDER variable. If the answer is YES, then the UP charge pump current is increased by one (1) at a step 676. After that occurs, the logic flow is directed to "D."

If the result at decision step 674 was NO, a decision step 680 determines if the variable TARGET_CLK is greater than the variable DOWN_CLK. If the answer is YES, the DOWN charge pump current is reduced by one (1) by a step 682. After that occurs, the logic flow is directed to letter "D." If the answer is NO, then the logic flow is directed to a decision step 684.

At decision step 684, it is determined if the variable TARGET_CLK is less than variable DOWN_CLK. If the answer is YES, then the DOWN charge pump current is increased by one (1) at a step 686. The logic flow is then directed to letter "D." If the answer is NO at decision step 684, the logic flow is directed to a decision step 690.

At decision step 690, it is determined if the variable TARGET_REMAINDER is greater than the variable DOWN_REMAINDER. If the answer is YES then the DOWN charge pump current is reduced by one (1) at a step 692. The logic flow is then directed to the letter "D." If the answer is NO at decision step 690, the logic flow is directed to a decision step 694.

At decision step 694, it is determined whether the variable TARGET_REMAINDER is less than the variable DOWN_REMAINDER. If the answer is YES, the DOWN charge pump current is increased by one (1) at a step 696, and the logic flow is then directed to the letter "D." If the answer is NO, then the logic flow is immediately directed to the letter "D,", which directs the logic flow back to step 608 on FIG. 11.

When attempting to compare the flow charts of FIGS. 11–14 to the computer program listed hereinabove, it is important to note that part of the initialization procedure starting at step 600 on FIG. 11 includes providing certain variables with initial values. Some of the variables that are given predetermined values include: UP_CLK, UP_REMAINDER, UP_CLK_PERIOD, TARGET_CLK, and TARGET_FRACTION. In addition, it is preferred that the calculation of the TARGET_REMAINDER at step 626 on FIG. 12 results in an integer number, and its value as it is calculated is preferably rounded to the nearest integer.

It should also be noted that the lines 82–84, 88–90, 96–98, and 102–104 on the above-referenced computer program are essentially comments that refer to some of the functions that occur in the lines 10–16.

It also should be noted that if the UP charge pump current and the DOWN charge pump current are symmetrical for a given charge pump circuit, then the steps described in the flow chart of FIGS. 11–14 that either increase or decrease an "UP" charge pump current or a "DOWN" charge pump current could be combined into one-half the logical decisions, since an increase in a symmetrical charge pump current will achieve the same result for both UP or DOWN.

It will be understood that the principles of the present invention can apply to any shape of a spread spectrum profile, and not only to the preferred spread spectrum profile that is rather "peaky" as disclosed in FIG. 8. In a situation where a sinusoidal modulation is preferable as the spread spectrum profile, then the resulting error profile will have the appearance of the graph 700 illustrated in FIG. 15. For example, when the PLL system operates at its nominal gain, then the UP and DOWN error time across a single period of the sinusoidal spread spectrum profile which has 128 separate intervals (as described above) is given by the rather jagged curve 702. It can be seen from FIG. 15 that the error profile also has somewhat of a sinusoidal shape.

Figure 15:
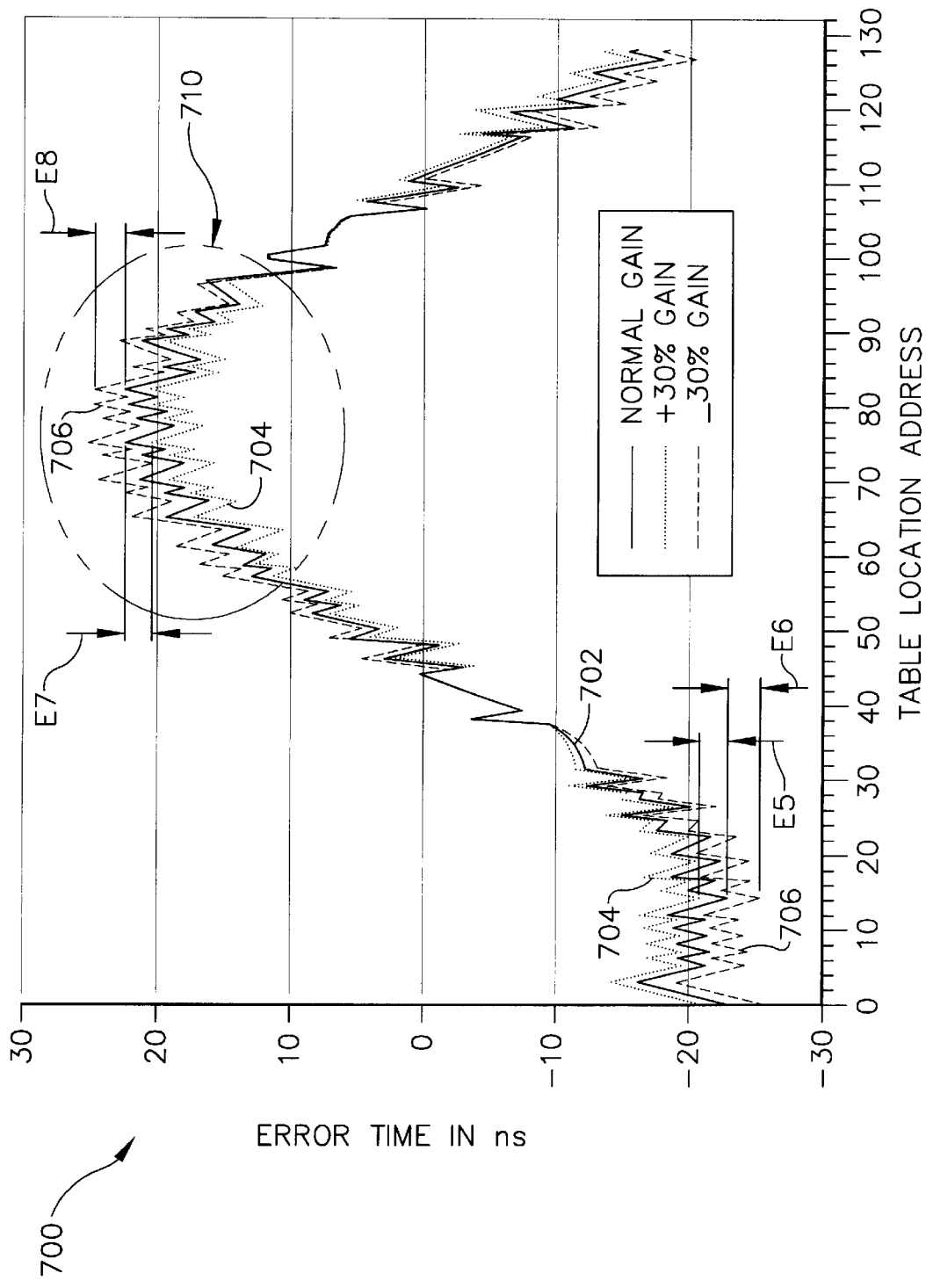
FIG. 15 is a graph showing the error profile for UP and DOWN signals for a spread spectrum clock generator that uses sinusoidal modulation.

If the PLL circuit exhibits a gain that is about 30% above nominal, then the jagged curve 704 on FIG. 15 will result. It can be seen from graph 700 that an increase in the gain will result in UP and DOWN pulse width duration times that are somewhat less than the resulting pulse width duration times when the gain is at its nominal value. In this sinusoidal example, it turns out that the maximum deviation between the nominal gain curve 702 and the +30% gain curve 704 occurs near the maximum pulse width timings, both in the positive and negative directions (i.e., with respect to graph 700's Y-axis). For example, at approximately the profile interval fifteen (15), the deviation between the nominal gain curve 702 and the +30% gain curve 704 is indicated at the "error" value designated as "E5." Similarly, at approximately the profile interval seventy-five (75), the error deviation between these two curves is designated as "E7." FIG. 16 illustrates an expanded scale so as to more easily see the various curves and error deviation designations between the profile intervals in the range of 51–101, as indicated by the circle 710 on FIG. 15.

A relatively large deviation between the nominal gain curve 702 and the −30% gain curve 706 also occurs near the maximum UP and DOWN pulse width duration times, which also occur around the profile interval fifteen (15) and the profile interval seventy-five (75) on FIG. 15. These relatively large deviations between the curves 702 and 706 are illustrated on FIG. 15 by the error designations "E6" and "E8." As can be seen from FIG. 15, as the effective PLL gain decreases from the nominal gain, the UP and DOWN pulse width duration times increase.

Figure 16:
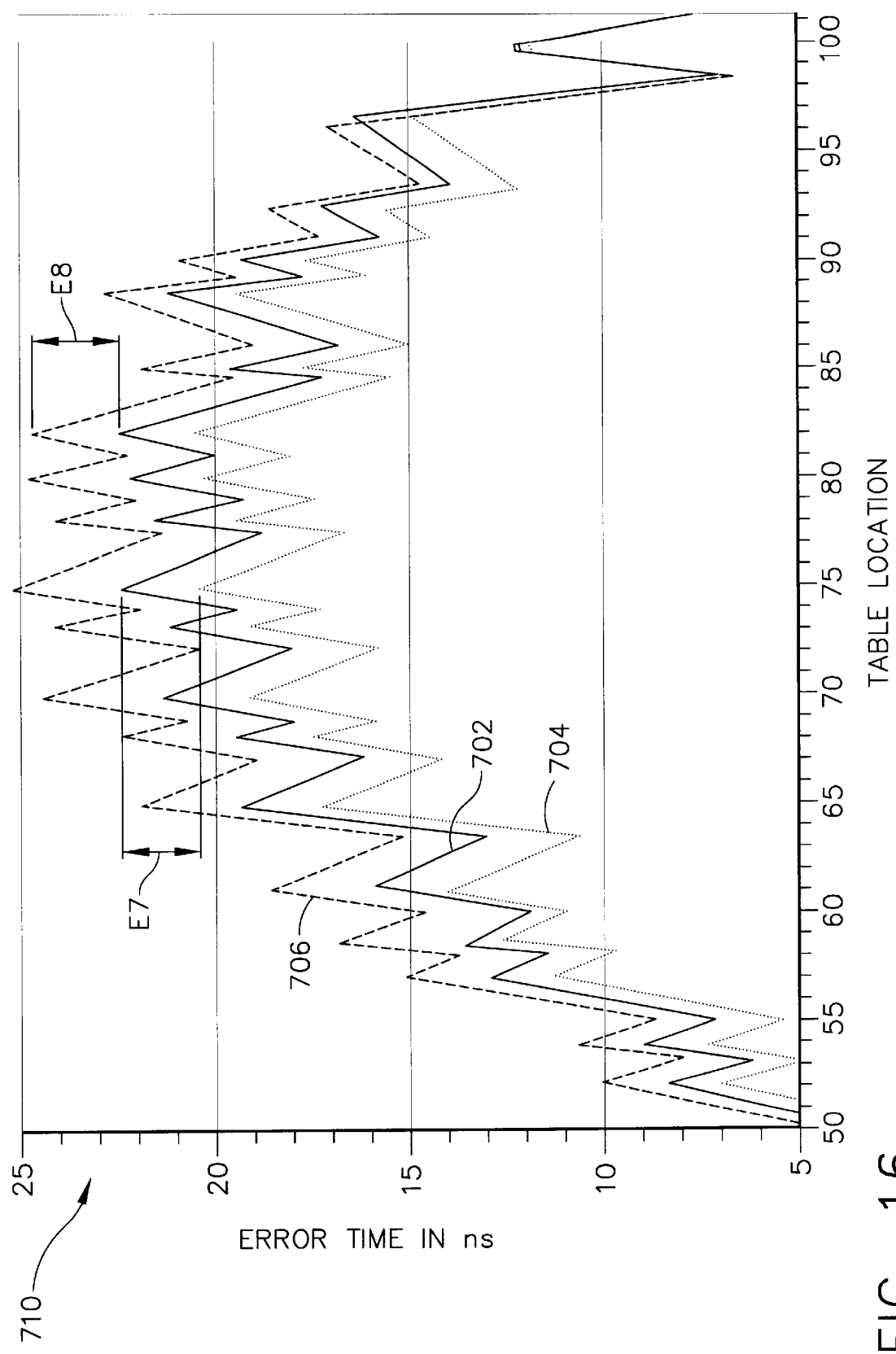
FIG. 16 is a graph of a portion of FIG. 15 that has been expanded for clarification.

FIG. 16 provides an expanded view of the UP and DOWN error times of the graph 700, as indicated by the circle 710. As discussed in the previous paragraph, the error designations E7 and E8 both occur near the profile interval 75, which curves exhibit a relatively large error deviation at these interval locations.

In this sinusoidal example of FIGS. 15 and 16, it can be seen that the largest error deviations occur at the largest duration times of the pulse widths for the UP and DOWN signals. In view of this fact, the delay chain 300 could be used to capture the accumulated maximum (or "peak") pulse widths for these signals.

It will be understood that the spread spectrum clock generator of the present invention could be used to generate any range of frequencies at its output 136 without departing from the principles of the present invention. It may be more efficient to create a certain frequency range for the spread spectrum profile by use of an external crystal/oscillator circuit that generates a particular frequency, however, the most important aspect in choosing components is to use an external clock that has a very stable frequency output, in which the circuit designer can depend upon the accuracy of that clock in actual time per period of its waveform. Another critical factor is noticeable in situations where an ASIC is used for the logic gates that make up the delay chain. It is important that the ASIC logic gates all be located on a single substrate so that their actual propagation delay times will be relatively equal from one delay gate element to the next. It is much less important that these propagation delay timings be accurate, since the present invention can easily calibrate these delay gates by use of the very accurate external clock.

It will further be understood that the principles of the present invention will work with any type of modulated waveform for the spread spectrum profile, not only including a sinusoidal profile, but including a very smooth profile or a jagged or "peaky" profile, which of course, is the preferred embodiment of the present invention.

It will be yet further understood that the principles of the present invention apply equally to situations where the spread spectrum clock is calibrated repeatedly after the equipment is placed in the field at a customer's site, or where it is calibrated one time in a production line set-up station that stores parameters about components that have sufficient long-term repeatability so as to not require frequent calibrations in the field.

The foregoing description of a preferred embodiment of the invention has been presented for purposes of illustration and description. It is not intended to be exhaustive or to limit the invention to the precise form disclosed. Obvious modifications or variations are possible in light of the above teachings. The embodiment was chosen and described in order to best illustrate the principles of the invention and its practical application to thereby enable one of ordinary skill in the art to best utilize the invention in various embodiments and with various modifications as are suited to the particular use contemplated. It is intended that the scope of the invention be defined by the claims appended hereto.

What is claimed is:

1. A method for controlling a spread spectrum clock generator, said method comprising:
    (a) providing a substantially accurate clock signal to a frequency synthesizer circuit, and providing a controller; said frequency synthesizer generating a plurality of output frequencies over time;
    (b) measuring an actual pulse-width duration of at least one of an UP signal and a DOWN signal generated by a phase frequency detector of said frequency synthesizer, and comparing said actual pulse-width duration with a predetermined typical time duration to find a difference therebetween, thus deriving a deviation error signal;
    (c) controlling a physical parameter of said frequency synthesizer, based upon said deviation error signal, to compensate for the difference between said actual pulse-width duration and said predetermined typical time duration, thereby more accurately controlling said frequency synthesizer's plurality of output frequencies over time to emulate a predetermined target spread spectrum profile.

2. The method as recited in claim 1, wherein said measuring an actual pulse-width duration function, and said controlling a physical parameter function, both occur automatically at run time of said sprectrum clock generator.

3. The method as recited in claim 1, wherein said measuring an actual pulse-width duration function, and said controlling a physical parameter function, both occur during a set-up operation at time of manufacturing said spread spectrum clock generator, which thereafter operates at run time using the factory set-up.

4. The method as recited in claim 1, wherein said frequency synthesizer comprises a phase locked loop circuit and logic.

5. The method as recited in claim 4, wherein said phase locked loop includes a charge pump, a voltage controlled oscillator and a divide-by-N counter; and wherein controlling a physical parameter of said phase locked loop comprises one of (i) varying said charge pump current, (ii) loading a different value of N into said divide-by-N counter, and (iii) varying said voltage controlled oscillator's gain.

6. The method as recited in claim 5, further comprising:
    (a) providing an address counter that receives an output signal from said divide-by-N counter, a table of values in a memory that receives an address value from said address counter, and an adder circuit that receives a data value from said table in memory and receives a data value from a base number register, wherein said adder circuit outputs a data signal that is used by said divide-by-N counter as the current value of N;
    (b) during for a first predetermined profile interval of a spread spectrum period, providing a constant value of N to said divide-by-N counter; and
    (c) during a next predetermined profile interval of said spread spectrum period, at the conclusion of said first predetermined profile interval, providing a different constant value of N to said divide-by-N counter, thereby causing said phase locked loop to output a different frequency during said next predetermined profile interval.

7. The method as recited in claim 1, wherein the difference between said actual pulse-width duration and said predetermined typical time duration is measured at a profile interval of a spread spectrum profile of said frequency synthesizer's plurality of output frequencies over time that exhibits a substantially maximum of said actual pulse-width duration times of said UP and DOWN signals; and wherein said maximum actual pulse-width duration occurs shortly after a significant change in slope of said spread spectrum profile of said frequency synthesizer's plurality of output frequencies over time.

8. The method as recited in claim 7, wherein said spread spectrum profile exhibits a substantially peaky shape with respect to said frequency synthesizer's plurality of output frequencies versus time; said substantially peaky shape including a maximum peak wherein the slope changes significantly, and including a minimum valley wherein the slope changes significantly.

9. The method as recited in claim 7, wherein said spread spectrum profile exhibits a substantially smooth shape with respect to said frequency synthesizer's plurality of output frequencies versus time; said substantially smooth shape including a sinusoidal shape.

10. The method as recited in claim 1, wherein the difference between said actual pulse-width duration and said predetermined typical time duration is measured at a profile interval of a spread spectrum profile of said frequency synthesizer's plurality of output frequencies over time that exhibits a relatively large deviation error signal, but does not necessarily exhibit a substantially maximum of said actual pulse-width duration times of at least one of said UP and DOWN signals; and wherein said relatively large deviation error signal occurs shortly before a significant change in slope of said spread spectrum profile of said frequency synthesizer's plurality of output frequencies over time.

11. The method as recited in claim 10, wherein said spread spectrum profile exhibits a substantially peaky shape with respect to said frequency synthesizer's plurality of output frequencies versus time; said substantially peaky shape including a maximum peak wherein the slope changes significantly, and including a minimum valley wherein the slope changes significantly.

12. The method as recited in claim 10, wherein said spread spectrum profile exhibits a substantially smooth shape with respect to said frequency synthesizer's plurality of output frequencies versus time; said substantially smooth shape including a sinusoidal shape.

13. The method as recited in claim 1, further comprising calibrating a delay chain comprising a plurality of in-series delay stages, wherein said substantially accurate clock signal is of a known frequency and is used to determine a propagation time delay per delay stage; and wherein said delay chain thereafter measures the actual pulse-width duration of said UP and DOWN signals.

14. The method as recited in claim 13, wherein each of said delay stages of the delay chain comprises a delay element and a flip-flop; and further comprising measuring, by use of said delay chain, an instantaneous actual pulse-width duration of said UP signal, said DOWN signal, and said substantially accurate clock signal.

15. The method as recited in claim 13, wherein each of said delay stages of the delay chain comprises a delay element, a flip-flop, and a logic circuit that maintains an output signal state of said flip-flop; and further comprising accumulating, by use of said delay chain, said delay chain pulse-width information, thereby measuring a maximum of said actual pulse-width duration times of a plurality of said UP signals and said DOWN signals.

16. The method as recited in claim 13, wherein each of said delay stages of the delay chain comprises a delay element, a flip-flop, a first logic circuit that maintains an output signal state of said flip-flop, and a second logic circuit that operates in two modes; and further comprising calibrating, by use of said second logic circuit's first mode of operation, said delay chain while measuring an instantaneous actual pulse-width duration of said substantially accurate clock signal, and accumulating, by use of said delay chain and said second logic circuit's second mode of operation, pulse-width information, thereby measuring a maximum of said actual pulse-width duration times of a plurality of said UP signals and said DOWN signals.

17. A spread spectrum clock generating circuit, comprising:
(a) a clock circuit that generates a known, substantially constant frequency output clock signal; (b) a frequency synthesizer circuit that generates a plurality of output frequencies over time;
(c) a controller that is configured to (i) measure an actual pulse-width duration of at least one of an UP signal and a DOWN signal generated by a phase frequency detector of said frequency synthesizer, (ii) compare said actual pulse-width duration with a predetermined typical time duration to find a difference therebetween and thus derive a deviation error signal, and (iii) automatically compensate for the difference between said actual pulse-width duration and said predetermined typical time duration by controlling a physical parameter of said frequency synthesizer, based upon said deviation error signal; thereby more accurately controlling said frequency synthesizer's plurality of output frequencies over time to emulate a predetermined target spread spectrum profile.

18. The spread spectrum clock generating circuit as recited in claim 17, wherein the difference between said actual pulse-width duration and said predetermined typical time duration is determined during at least one profile interval of a spread spectrum profile of said frequency synthesizer's plurality of output frequencies over time that exhibits a substantially maximum of said actual pulse-width duration times of said UP and DOWN signals; and wherein said maximum said actual pulse-width duration occurs shortly after a significant change in slope of said spread spectrum profile of said frequency synthesizer's plurality of output frequencies over time.

19. The spread spectrum clock generating circuit as recited in claim 17, wherein the difference between said actual pulse-width duration and said predetermined typical time duration, referred to as an error signal, is determined at a profile interval of a spread spectrum profile of said frequency synthesizer's plurality of output frequencies over time that exhibits a relatively large deviation in the error signal, but does not necessarily exhibit a substantially maximum of said actual pulse-width duration of said UP and DOWN signals; and wherein said relatively large deviation error signal occurs shortly before a significant change in slope of said spread spectrum profile of said frequency synthesizer's plurality of output frequencies over time.

20. The spread spectrum clock generating circuit as recited in claim 17, further comprising a plurality of in-series delay stages that make up a delay chain, wherein said substantially constant frequency output clock signal is used to determine a propagation time delay per delay stage; and wherein said delay chain thereafter measures the actual pulse-width duration of said UP and DOWN signals.

21. The spread spectrum clock generating circuit as recited in claim 20, wherein each of said delay stages of the delay chain comprises a delay element and a flip-flop; and said delay chain measures an instantaneous actual pulse-width duration of said UP signal, said DOWN signal, and said substantially constant frequency output clock signal.

22. The spread spectrum clock generating circuit as recited in claim 20, wherein each of said delay stages of the delay chain comprises a delay element, a flip-flop, and a logic circuit that maintains an output signal state of said flip-flop; and said delay chain accumulates pulse-width information and thereby measures a maximum of said actual pulse-width duration times of a plurality of said UP signals and said DOWN signals.

23. The spread spectrum clock generating circuit as recited in claim 20, wherein each of said delay stages of the delay chain comprises a delay element, a flip-flop, a first logic circuit that maintains an output signal state of said flip-flop, and a second logic circuit that, in a first mode, calibrates said delay chain while operating to measure an instantaneous actual pulse-width duration of said substantially constant frequency output clock signal, and that, in a second mode, causes said delay chain to accumulate pulse-width information and thereby measure a maximum of said actual pulse-width duration times of a plurality of said UP signals and said DOWN signals.

24. The spread spectrum clock generating circuit as recited in claim 17, wherein said frequency synthesizer comprises a phase locked loop circuit and logic.

25. The spread spectrum clock generating circuit as recited in claim 24, wherein said phase locked loop includes a charge pump, a voltage controlled oscillator, and a divide-by-N counter; and wherein controlling a physical parameter of said phase locked loop comprises one of (i) varying said charge pump current, (ii) loading a different value of N into said divide-by-N counter, and (iii) varying said voltage controlled oscillator's gain.

26. The spread spectrum clock generating circuit as recited in claim 25, further comprising an address counter that receives an output signal from said divide-by-N-counter, a table of values in a memory that receives an address value from said address counter, and an adder circuit that receives a data value from said table in memory and receives a data value from a base number register, wherein said adder circuit outputs a data signal that is used by said divide-by-N counter as the current value of N.

27. The spread spectrum clock generating circuit as recited in claim 26, wherein said address counter, table, and adder circuit provide a constant value of N to said divide-by-N counter for a first predetermined profile interval of a spread spectrum period, and at the conclusion of said first predetermined profile interval said address counter, table, and adder circuit provide a different constant value of N to said divide-by-N counter for a next predetermined profile interval of said spread spectrum period, thereby causing said phase locked loop to output a different frequency during said next predetermined profile interval.

28. The spread spectrum clock generating circuit as recited in claim 27, further comprising a multiplexer circuit that receives as inputs said UP signal, said DOWN signal, and said known, substantially constant frequency output clock signal; and further comprising a plurality of in-series delay stages that make up a delay chain, wherein said known, substantially constant frequency output clock signal is used to determine a propagation time delay per delay stage; and wherein said delay chain measures the actual pulse-width duration of said UP and DOWN signals.

29. The spread spectrum clock generating circuit as recited in claim 28 wherein said table in memory and said base number register are comprised of Random Access Memory, and wherein controlling a physical parameter of said phase locked loop comprises one of (i) varying a charge pump current of said phase locked loop, (ii) loading a value of N into said divide-by-N counter, (iii) varying a voltage controlled oscillator's gain of said phase locked loop, (iv) varying at least one data value of said table, and (v) varying a data value of said base number.

30. The spread spectrum clock generating circuit as recited in claim 29, wherein said controller comprises a processing circuit that is configured to: (i) control the operation of said multiplexer, (ii) control a calibration mode and accumulation mode of said delay chain, (iii) control a reset mode of said delay chain, (iv) control said physical parameter, (v) receive and analyze inputs from said delay chain, and (vi) receive and analyze a profile interval location input.

31. The spread spectrum clock generating circuit as recited in claim 29, wherein said controller comprises a logic state machine circuit that is configured to: (i) control the operation of said multiplexer, (ii) control a calibration mode and accumulation mode of said delay chain, (iii) control a reset mode of said delay chain, (iv) control said physical parameter, (v) receive and analyze inputs from said delay chain by way of a plurality of registers, and (vi) receive and analyze a profile interval location input.

32. The spread spectrum clock generating circuit as recited in claim 28, wherein said table in memory is comprised of Read Only Memory, and wherein controlling a physical parameter of said phase locked loop comprises one of (i) varying a charge pump current of said phase locked loop, (ii) loading a value of N into said divide-by-N counter, and (iii) varying a voltage controlled oscillator's gain of said phase locked loop.

33. The spread spectrum clock generating circuit as recited in claim 32, wherein said controller comprises a processing circuit that is configured to: (i) control the operation of said multiplexer, (ii) control a calibration mode and accumulation mode of said delay chain, (iii) control a reset mode of said delay chain, (iv) control said physical parameter, (v) receive and analyze inputs from said delay chain, and (vi) receive and analyze a profile interval location input.

34. The spread spectrum clock generating circuit as recited in claim 32, wherein said controller comprises a logic state machine circuit that is configured to: (i) control the operation of said multiplexer, (ii) control a calibration mode and accumulation mode of said delay chain, (iii) control a reset mode of said delay chain, (iv) control said physical parameter, (v) receive and analyze inputs from said delay chain by way of a plurality of registers, and (vi) receive and analyze a profile interval location input.

* * * * *